(12) United States Patent
Lee et al.

(10) Patent No.: US 11,770,898 B2
(45) Date of Patent: Sep. 26, 2023

(54) SUBSTRATE STRUCTURE AND ELECTRONIC DEVICE INCLUDING THE SAME

(71) Applicant: SAMSUNG ELECTRO-MECHANICS CO., LTD., Suwon-si (KR)

(72) Inventors: Seung Eun Lee, Suwon-si (KR); Yong Hoon Kim, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 497 days.

(21) Appl. No.: 16/902,738

(22) Filed: Jun. 16, 2020

(65) Prior Publication Data
US 2021/0289629 A1 Sep. 16, 2021

(30) Foreign Application Priority Data

Mar. 11, 2020 (KR) .................. 10-2020-0030246

(51) Int. Cl.
*H05K 1/18* (2006.01)
*H05K 1/14* (2006.01)
(Continued)

(52) U.S. Cl.
CPC ........ *H05K 1/181* (2013.01); *H01L 23/49822* (2013.01); *H01L 23/49833* (2013.01);
(Continued)

(58) Field of Classification Search
CPC ........ H05K 1/181; H05K 1/111; H05K 1/145; H05K 2201/042; H05K 2201/10015;
(Continued)

(56) References Cited

U.S. PATENT DOCUMENTS

| 6,418,029 | B1 * | 7/2002 | McKee | H05K 1/145 |
| | | | | 361/803 |
| 7,317,622 | B2 * | 1/2008 | Li | H05K 1/0231 |
| | | | | 361/306.3 |

(Continued)

*Primary Examiner* — Steven T Sawyer
(74) *Attorney, Agent, or Firm* — MORGAN, LEWIS & BOCKIUS LLP

(57) ABSTRACT

A substrate structure includes a first printed circuit board having a first side and a second side opposing each other, and a plurality of passive components connected to the first side of the first printed circuit board. The plurality of passive components includes a first group, including a plurality of first passive components disposed adjacent to each other, and a second group, including a plurality of second passive components disposed adjacent to each other. A smallest distance between the first and second groups is greater than at least one of a smallest distance between adjacent first passive components of the plurality of first passive components and a smallest distance between adjacent second passive components of the plurality of second passive components. An electronic device includes a first printed circuit board disposed on a mainboard and having, on opposite sides thereof, a semiconductor chip and a plurality of passive components.

21 Claims, 20 Drawing Sheets

(51) Int. Cl.
*H05K 1/11* (2006.01)
*H01L 23/498* (2006.01)

(52) U.S. Cl.
CPC ............ *H05K 1/111* (2013.01); *H05K 1/145* (2013.01); *H05K 2201/042* (2013.01); *H05K 2201/10015* (2013.01); *H05K 2201/10378* (2013.01); *H05K 2201/10674* (2013.01); *H05K 2201/10734* (2013.01)

(58) Field of Classification Search
CPC .......... H05K 2201/10378; H05K 2201/10674; H05K 2201/10734; H05K 1/18; H05K 1/141; H05K 1/182; H05K 1/119; H05K 3/305; H05K 1/023; H05K 2201/10636; H05K 2201/049; H05K 1/144; H01L 23/49822; H01L 23/49833; H01L 23/49827; H01L 23/49838; H01L 23/49816; H01L 23/50; H01L 25/0657; H01L 2924/19041; H01G 4/38; H01G 4/40

See application file for complete search history.

(56) References Cited

U.S. PATENT DOCUMENTS

| | | | |
|---|---|---|---|
| 8,035,216 B2 | 10/2011 | Skeete | |
| 9,263,186 B2 | 2/2016 | Li et al. | |
| 2006/0091564 A1* | 5/2006 | Zhong | H01L 23/50 257/E23.079 |
| 2006/0158863 A1* | 7/2006 | Hsu | H01L 23/49816 257/E23.079 |
| 2010/0265682 A1* | 10/2010 | Martinez | H01L 23/50 29/832 |
| 2014/0252544 A1* | 9/2014 | Li | H01G 4/38 257/532 |
| 2015/0098204 A1* | 4/2015 | Yoshikawa | H01L 23/00 361/767 |
| 2018/0012838 A1* | 1/2018 | Arvin | H01L 24/48 |
| 2018/0366423 A1* | 12/2018 | Ong | H01L 23/49827 |
| 2020/0176427 A1* | 6/2020 | Ramachandran | H01L 22/20 |
| 2020/0373285 A1* | 11/2020 | Hovis | H05K 1/0231 |

* cited by examiner

SUBSTRATE STRUCTURE AND ELECTRONIC DEVICE INCLUDING THE SAME

CROSS-REFERENCE TO RELATED APPLICATION(S)

This application claims the benefit under 35 USC 119(a) of Korean Patent Application No. 10-2020-0030246 filed on Mar. 11, 2020 in the Korean Intellectual Property Office, the entire disclosure of which is incorporated herein by reference for all purposes.

BACKGROUND

1. Field

The present disclosure relates to a substrate structure and an electronic device including the same.

2. Description of Related Art

As the number and integration density of input/output (I/O) units have been significantly increased with the trend for high-performance electronic products, there has been demand for technologies for a high-multilayer and large-scale substrate. For example, there is a need to increase a size of a flip chip ball grid array (FCBGA) substrate for a high-performance semiconductor and the number of layers. Such demand causes issues such as an increase in technical difficulty of manufacturing and mounting and a decrease in yield, which results in an increase in costs. Accordingly, there is demand for technologies capable of reducing manufacturing costs while maintaining semiconductor performance. In addition, power integrity has emerged as an important characteristic with the trend for high performance of electronic products.

SUMMARY

An aspect of the present disclosure is to provide a substrate structure capable of improving power integrity and an electronic device including the same.

An aspect of the present disclosure is to provide a substrate structure capable of satisfying demand for a high-multilayer and large-scale substrate, and an electronic device including the same.

An aspect of the present disclosure is to provide a substrate structure capable of reducing costs and an electronic device including the same.

According to an aspect of the present disclosure, a plurality of passive components are grouped on a substrate surface to overlap with a functional circuits of a semiconductor chip mounted on the substrate.

According to an aspect of the present disclosure, a printed circuit board is disposed on another printed circuit board to provide a substrate structure.

For example, a substrate structure includes a first printed circuit board having a first side and a second side opposing each other, and a plurality of passive components connected to the first side of the first printed circuit board. The plurality of passive components includes a first group, including a plurality of first passive components disposed adjacent to each other, and a second group, including a plurality of second passive components disposed adjacent to each other. A smallest distance between the first and second groups is greater than at least one of a smallest distance between adjacent first passive components of the plurality of first passive components or a smallest distance between adjacent second passive components of the plurality of second passive components.

For example, an electronic device includes a mainboard, a first printed circuit board disposed on the mainboard, a semiconductor chip disposed on one side of the first printed circuit board, and a plurality of passive components disposed on another side of the first printed circuit board. The plurality of passive components include a first group, including a plurality of first passive components, and a second group, including a plurality of second passive components. The semiconductor chip includes a first functional circuit and a second functional circuit disposed adjacent to each other on a plane. At least a portion of the first group overlaps the first functional circuit, when viewed from above, and at least a portion of the second group overlaps the second functional circuit, when viewed from above.

In a further aspect of the disclosure, a printed circuit board has first and second surfaces opposing each other in a first direction, and is configured for having a semiconductor chip, having first and second functional circuits disposed adjacent to each other on a plane, mounted on the second surface. The printed circuit board includes a planar insulating layer, first and second passivation layers each disposed between the planar insulating layer and a respective one of the first and second surfaces, and each having openings exposing pads through the respective one of the first or second surface, and a plurality of passive components disposed on the first surface of the printed circuit board and connected to a plurality of pads exposed through the first surface. A first passive component of the plurality of passive components is disposed in an area overlapped in the first direction by the first functional circuit of the semiconductor chip, and a second passive component of the plurality of passive components is spaced apart from the first passive component and is disposed in an area overlapped in the first direction by the second functional circuit of the semiconductor chip.

In another aspect of the disclosure, a printed circuit board has first and second surfaces opposing each other in a first direction, and is configured for having a semiconductor chip, having an input/output interface functional circuit therein, mounted on the second surface. The printed circuit board includes a planar insulating layer, first and second passivation layers each disposed between the planar insulating layer and a respective one of the first and second surfaces, and each having openings exposing pads through the respective one of the first or second surface, and a plurality of passive components disposed on the first surface of the printed circuit board and connected to a plurality of pads exposed through the first surface. A first passive component of the plurality of passive components is disposed in an area overlapped in the first direction by the input/output interface functional circuit of the semiconductor chip.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, embodiments of the present disclosure will be described as follows with reference to the attached drawings.

Figure 1:
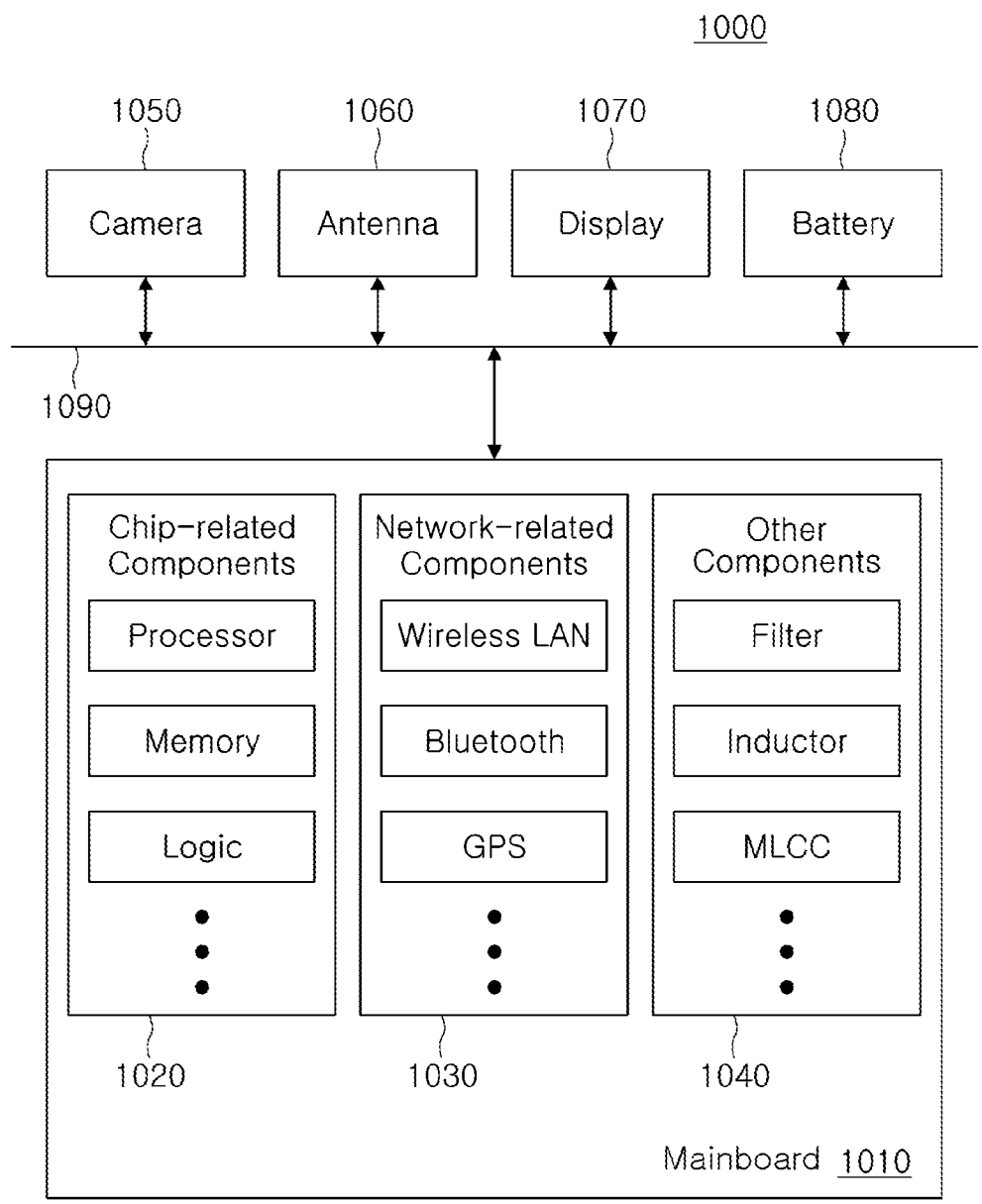
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a DRAM), a nonvolatile memory (for example, a ROM), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; a logic chip such as an analog-to-digital converter, and an application-specific integrated circuit (ASIC), or the like. However, the chip related components 1020 are not limited thereto, but may also include other types of chip related components. In addition, the chip related components 1020 may be combined with each other. The chip related components 1020 may be in the form of a package including the above-mentioned chip or electronic component.

The network related components 1030 may include components compatible with and implementing various protocols such as Wi-Fi (Institute of Electrical And Electronics Engineers (IEEE) 802.11 family, or the like), WiMAX (IEEE 802.16 family, or the like), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, and 5G protocols, and any other wireless and wired protocols, designated after the abovementioned protocols. However, the network related components 1030 are not limited thereto, and may also include components compatible with and implementing a variety of other wireless or wired standards or protocols. In addition, the network related components 1030 may be combined with each other, together with the chip related components 1020 described above.

Other components 1040 may include a high-frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, and the like. However, these other components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
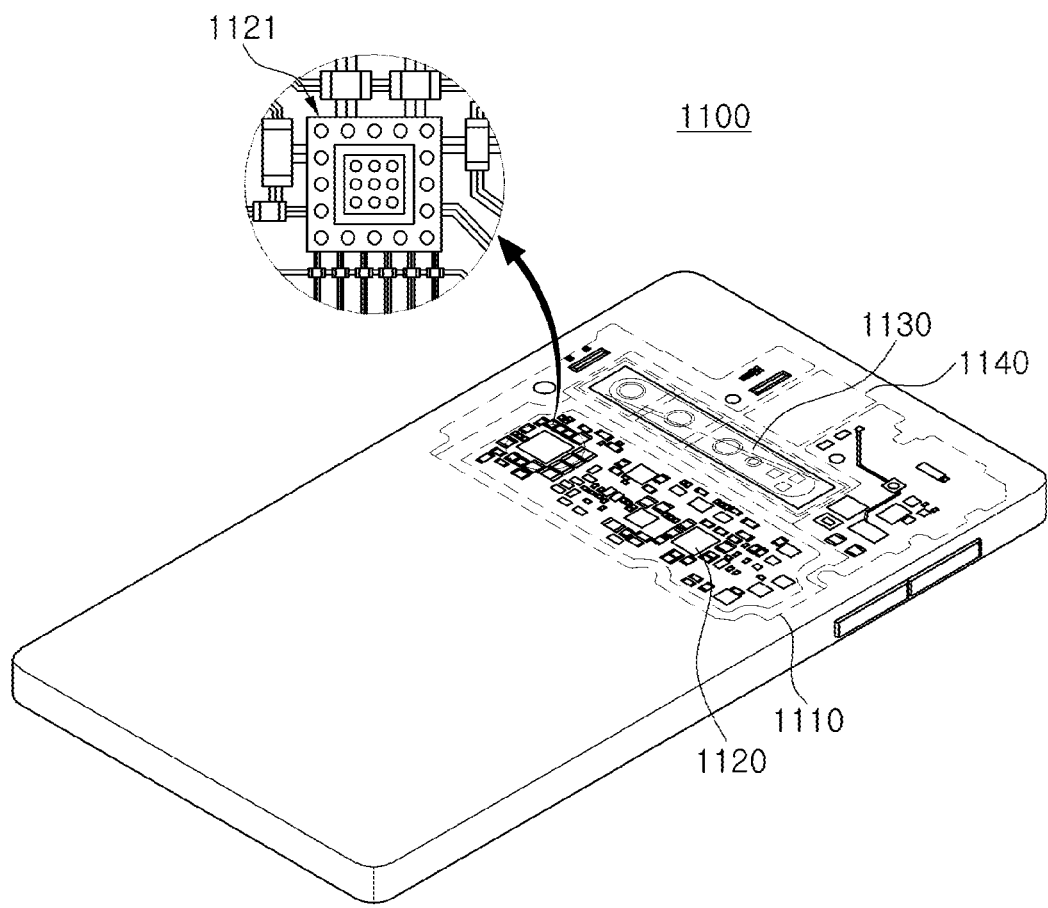
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other components that may or may not be physically or electrically connected to the mainboard 1110, such as a camera module 1130 and/or a speaker 1140, may be accommodated in the electronic device. A portion of the electronic components 1120 may be the chip related components, for example, a semiconductor package 1121, but are not limited thereto. The semiconductor package 1121 may have a form in which a semiconductor chip or a passive component is surface-mounted on a package substrate in the form of a multilayer printed circuit board or a substrate structure including the package substrate. The electronic device is not necessarily limited to the smartphone 1100, but may be other electronic devices as described above.

Figure 3:
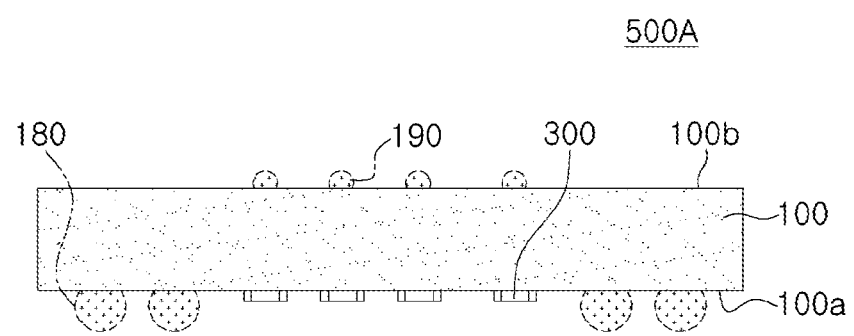
FIG. 3 is a schematic cross-sectional view illustrating an example of a substrate structure.

FIG. 3 is a schematic cross-sectional view illustrating an example of a substrate structure.

Figure 4:
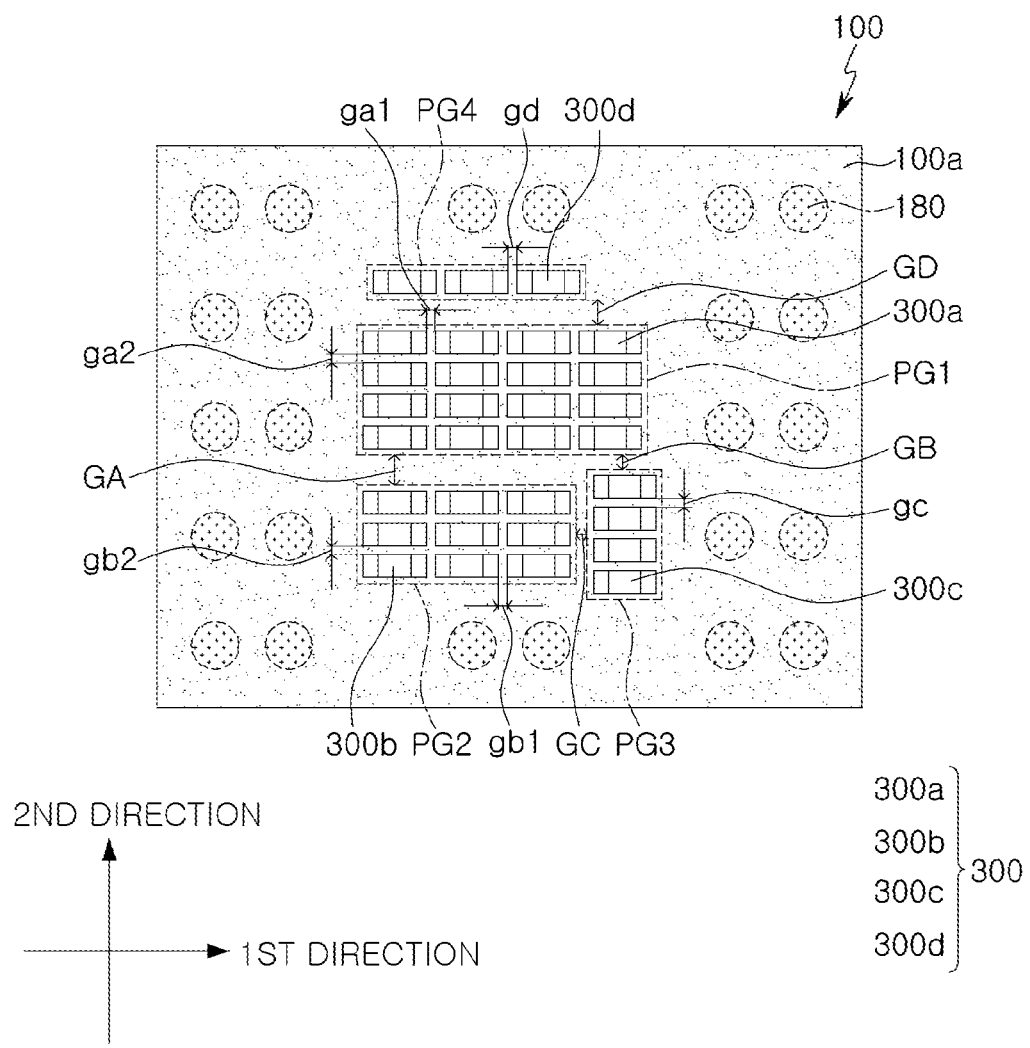
FIG. 4 is a schematic plan view illustrating a lower side of a printed circuit board of the substrate structure shown in FIG. 3.

FIG. 4 is a schematic plan view illustrating a lower side of a printed circuit board of the substrate structure in FIG. 3.

Referring to FIGS. 3 and 4, a substrate structure 500A according to an example includes a printed circuit board 100, having first and second sides 100a and 100b opposing each other, and a plurality of passive components 300. The substrate structure 500A according to an example may function as a package substrate. A passive components 300 may be, for example, a land side capacitor (LSC), connected to the side 100a of the printed circuit board 100, such that power integrity may be improved. When such an LSC is used, a size of the printed circuit board 100 may be additionally reduced, as compared with a die side capacitor (DSC). In addition, since a distance from a semiconductor chip (e.g., 400 in FIG. 6) disposed on the printed circuit board 100 may be relatively short, as compared with the DSC, the LSC may have a better power integrity effect.

The plurality of passive components 300 include a first group PG1 including a plurality of first passive components 300a disposed adjacent to each other, a second group PG2 including a plurality of second passive components 300b disposed adjacent to each other, a third group PG3 including a plurality of third passive components 300c disposed adjacent to each other, and a fourth group PG4 including a plurality of fourth passive components 300d disposed adjacent to each other. The number of groups among the first to fourth groups PG1 to PG4 may be adjusted. For example, the plurality of passive components 300 may include fewer groups than that those illustrated in the drawings, or may include more groups than those illustrated in the drawings.

When a plurality of passive components 300 includes a plurality of passive components 300a, 300b, 300c, and 300d which may be grouped into a plurality of groups PG1, PG2, PG3, and PG4, the plurality of passive components 300a, 300b, 300c, and 300d may be selectively disposed on a plane (e.g., a same plane) to overlap a plurality of respective units (e.g., functional circuit units) inside of a semiconductor chip (e.g., 400 in FIG. 6) disposed on the printed circuit board 100. For example, each of the passive components 300a, 300b, 300c, and 300d, grouped into groups PG1, PG2, PG3, and PG4, may be disposed directly below a main core unit or a specific input/output unit of a semiconductor chip. For example, passive components 300a, 300b, 300c, and 300d, grouped into a same group PG1, PG2, PG3, or PG4, may be disposed directly below a same respective functional circuit of a semiconductor chip, while passive components 300a, 300b, 300c, and 300d, grouped into different groups PG1, PG2, PG3, or PG4, may be disposed directly below different respective functional circuits of a semiconductor chip. Thus, a better power integrity improvement effect may be obtained.

The groups PG1, PG2, PG3, and PG4 may be determined according to the distances between adjacent passive components in each group and the distance between adjacent groups. In this regard, distances ga1 and ga2 may be defined as distances between adjacent first passive components 300a of the first group PG1 (e.g., distances in 1st and 2nd directions, respectively), and distances gb1 and gb2 may be defined as distances between adjacent second passive components 300b of the second group PG2 (e.g., distances in 1st and 2nd directions, respectively). Among distances GA between the first and second groups PG1 and PG2, a smallest distance may be greater than at least one of a smallest distance, among distances ga1 and ga2, and a smallest distance, among distances gb1 and gb2. Among distances GB between the first and third groups PG1 and PG3, a smallest distance may be greater than at least one of a smallest distance, among distances ga1 and ga2, and a smallest distance, among distances gc between adjacent third passive components 300c of the third group PG3. Among distances GC between the second and third groups PG2 and PG3, a smallest distance may be greater than at least one of a smallest distance, among distances gb1 and gb2, and a smallest distance, among distances gc between adjacent third passive components 300c of the third group PG3. Among distances GD between the first and fourth groups PG1 and PG4, a smallest distance may be greater than at least one of a smallest distance, among the distances ga1 and ga2, and a smallest distance, among distances gd between adjacent fourth passive components 300d of the fourth group PG4.

As described above, each passive component is grouped with passive component(s) it is closest to, such that each passive component is disposed closer to another component from the same group than to any passive component from any other group.

For better grouping into groups PG1, PG2, PG3, and PG4, the plurality of first passive components 300a of the first group PG1 are arranged at regular intervals ga1, based on a first direction on a plane, and may also be arranged at regular intervals ga2, based on a second direction on the plane. In addition, the plurality of second passive components 300b of the second group PG2 may be arranged at regular intervals gb1, based on the first direction on the plane, and may also be arranged at regular intervals gb2, based on the second direction on the plane. The plurality of third passive components 300c of the third group PG3 may be arranged at regular intervals gc, based on the second direction on the plane. The plurality of fourth passive components 300d of the fourth group PG4 may be arranged at regular intervals gd, based on the first direction on the plane. The "regular interval" includes a substantially regular interval.

For better grouping into groups PG1, PG2, PG3, and PG4, among the plurality of first to fourth passive components 300a, 300b, 300c, and 300d included in the first to fourth groups PG1, PG2, PG3, and PG4, at least two passive components may be different from each other. For example, the number (or count) of the plurality of first passive components 300a of the first group PG1 may be greater than the number of the plurality of second passive components 300b of the second group PG2, the number of the plurality of third passive components 300c of the third group PG3, and the number of the plurality of fourth passive components 300d of the fourth group PG4. In addition, the number of the plurality of second passive components 300b of the second group PG2 may be greater than the number of the third passive components of the third group PG3 and the number of the fourth passive components 300d of the fourth group PG4.

Each of the plurality of passive components 300 may be a chip-type passive component, for example, a chip-type capacitor or a chip-type inductor. An example of the chip-type passive component, introduced as each of the plurality of passive components 300, may be a multilayer ceramic capacitor (MLCC), a low inductance chip capacitor (LICC), or the like. Each of the plurality of passive components 300 may have two terminals. However, the number of terminals is not limited thereto, and each of the plurality of passive components 300 may have eight terminals.

The substrate structure 500A according to an example may further include a plurality of first connection metals 180 disposed on the first side 100a of the printed circuit board 100 to be connected to the first side 100a. The plurality of first connection metals 180 may surround the first to fourth groups PG1, PG2, PG3, and PG4, when viewed from above. Each of the first connection metals 180 may be an alloy including a low melting point metal, having a lower melting point than copper (Cu), such as tin (Sn) or a tin-containing alloy. For example, each of the first connection metals 180 may be formed of a solder, but the present disclosure is not limited thereto. The first connection metal 180 may be a land, a ball, a pin, or the like, and may have a multilayer structure or single-layer structure. When the first connection metal 180 has a multilayer structure, the first connection metal 180 may include a copper pillar and a solder. When the first connection metal 180 has a single-layer structure, the first connection metal 180 may include a tin-silver solder. However, this is only an example and the present disclosure is not limited thereto.

Figure 5:
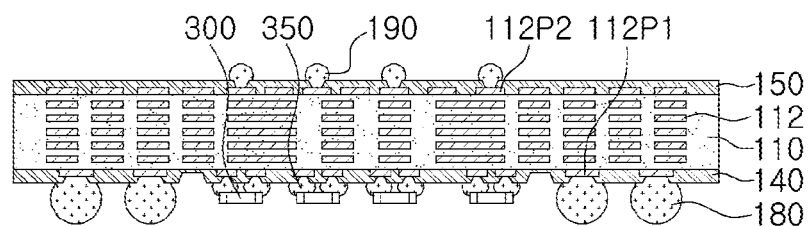
FIG. 5 is a schematic cross-sectional view illustrating a modified example of the substrate structure shown in FIG. 3.

FIG. 5 is a schematic cross-sectional view illustrating a modified example of the substrate structure in FIG. 3.

Referring to FIG. 5, a substrate structure 500A' according to a modified example may be a coreless-type printed circuit board (coreless PCB). When the printed circuit board 100 is a coreless PCB, a first connection metal 180 does not need to have a fine pitch. Therefore, rather than a low-profile LSC, a common LSC may be used as a plurality of passive components 300 to reduce costs.

Most of the other contents are substantially the same as described above, and thus, duplicate descriptions are omitted.

The printed circuit board 100 may include a build-up layer 110 and a plurality of wiring layers 112 embedded in the build-up layer 110. Vertically adjacent layers, disposed above and below each of a plurality of wiring layers 112, may be connected to each other through a plurality of vias penetrating through the build-up layer 110. A first passivation layer 140 may be disposed on a lower side of the build-up layer 110. A second passivation layer 150 may be disposed on an upper side of the build-up layer 110. The first passivation layer 140 may have a plurality of first openings, respectively exposing a plurality of first pads 112P1. A first connection metal 180 may be disposed on each of a plurality of the first openings to be connected to a respective first pad 112P1. The second passivation layer 150 may have a plurality of second openings, respectively exposing a plurality of second pads 112P2. A second connection metal 190 may be disposed on each of the second openings to be connected to a respective second pad 112P2. A plurality of passive components 300 may be disposed on openings of the plurality of first openings (e.g., disposed on openings that are free of the first connection metals 180). Each of the plurality of passive components 300 may be connected to a respective first pad 112P1 through a conductive adhesive 350. The printed circuit board 100 does not necessarily have to be a coreless-type printed circuit board and may be a core-type printed circuit board.

The build-up layer 110 may provide an insulating region for forming a multilayer wiring. The build-up layer 110 may include a plurality of insulating layers, and boundaries between the plurality of insulating layers may be apparent or may not be apparent. A material of the insulating layers may be an insulating material. In this case, the insulating material may be a thermosetting resin such as an epoxy resin, a thermoplastic resin such as polyimide, or a material including the thermosetting resin and the thermoplastic resin, a glass fiber, and/or a reinforcing material such as an inorganic filler, for example, PPG, ABF, or the like. Optionally, the material of the insulating layers may be a PID. On the other hand, the insulating layers may include the same material, or may include materials different from each other.

The wiring layer 112 may include a metal material such as copper (Cu), aluminum (Al), silver (Ag), tin (Sn), gold (Au), nickel (Ni), lead (Pb), titanium (Ti), or alloys thereof. The wiring layer 112 may be formed by a process such as an additive process (AP), a semi-AP (SAP), a modified SAP (MSAP), a tenting (TT) process, or the like. As a result, the wiring layer 112 may include a seed layer, serving as an electroless plating layer, and an electrolytic plating layer formed based on the seed layer. The wiring layer 112 may perform various functions depending on a design thereof. For example, the wiring layer 112 may include a ground pattern, a power pattern, a signal pattern, and the like. The signal pattern may include various signals, other than a ground pattern, a power pattern, and the like, such as a data signal, and the like. Each pattern may include a line pattern, a plane pattern, and/or a pad pattern. A via, including a connection via connected to the wiring layers 112, may also include a metal material. The via may also be formed by a plating processes such as an AP, an SAP, an MSAP, and a TT process. The via may also perform various functions depending on a design thereof. For example, the via may include a wiring via for signal connection, a wiring via for ground connection, a wiring via for power connection, and the like. The via may be completely filled with a metal material, or a metal material may be formed along a wall of a via hole. In addition, various shapes, such as a tapered shape and the like, may be applied to the via.

The passivation layers 140 and 150 are additional elements, and may protect an internal structure of the printed circuit board 100 from external physical and chemical damages. Each of the passivation layers 140 and 150 may include a thermosetting resin. For example, each of the passivation layers 140 and 150 may be an ABF. However, the present disclosure is not limited thereto, and each of the passivation layers 140 and 150 may be a SR layer. Optionally, each of the passivation layers 140 and 150 may include a PID. Each of the passivation layers 140 and 150 may have a plurality of openings. A surface treatment layer may be formed on surfaces of the pads 112P1 and 112P2 exposed through the plurality of openings. The surface treatment layer may be formed by, for example, electrolytic gold plating, electroless gold plating, OSP or electroless tin plating, electroless silver plating, electroless nickel plating/ substitution gold plating, DIG plating, HASL, or the like. Optionally, each of the openings may have a plurality of via holes. Optionally, an underbump metal (UBM) may be disposed on each of the openings to improve reliability.

The connection metals 180 and 190 are additional elements which may physically and/or electrically connect the printed circuit board 100 to an external entity. For example, the printed circuit board 100 may be mounted on another printed circuit board through the first connection metal 180. In addition, a semiconductor chip, or the like, may be surface-mounted on the printed circuit board 100 through the second connection metal 190. Each of the connection metals 180 and 190 may be disposed on each of the plurality of openings of the passivation layers 140 and 150 other than openings have passive components 300 thereon. Each of the connection metals 180 and 190 may include a low melting point metal, having a lower melting point than copper (Cu), such as tin (Sn) or a tin-containing alloy. For example, each of the connection metals 180 and 190 may be formed of a solder. However, this is only an example and the material of the connection metals 180 and 190 is not limited thereto.

Each of the connection metals 180 and 190 may be a land, a ball, a pin, or the like. Each of the connection metals 180 and 190 may have a multilayer structure or a single-layer structure. When having a multilayer structure, each of the connection metals 180 and 190 may include a copper pillar and a solder. When having a single-layer structure, each of the connection metals 180 and 190 may include a tin-silver solder. However, this is only an example and the present disclosure is not limited thereto. The number, an interval, a disposition form, and the like, of the connection metals 180 and 19 are not necessarily limited, and may be sufficiently modified depending on designs particulars.

The passive component 300 may be connected to the printed circuit board 100. Each of the plurality of passive components 300 may be a chip-type passive component, for example, a chip-type capacitor or a chip-type inductor. An example of the chip-type passive component, introduced as each of the plurality of passive components 300, may be a multilayer ceramic capacitor (MLCC), a low inductance chip capacitor (LICC), or the like. Each of the plurality of passive components 300 may have two terminals. However, the number of terminals is not limited thereto, and each of the plurality of passive components 300 may have eight terminals, or the like. A conductive adhesive 350 used for surface mounting of the passive component 300 may include a low melting point metal having a lower melting point than copper (Cu), for example, tin (Sn) or a tin-containing alloy, in further detail, a solder. However, the present disclosure is not limited thereto.

Figure 6:
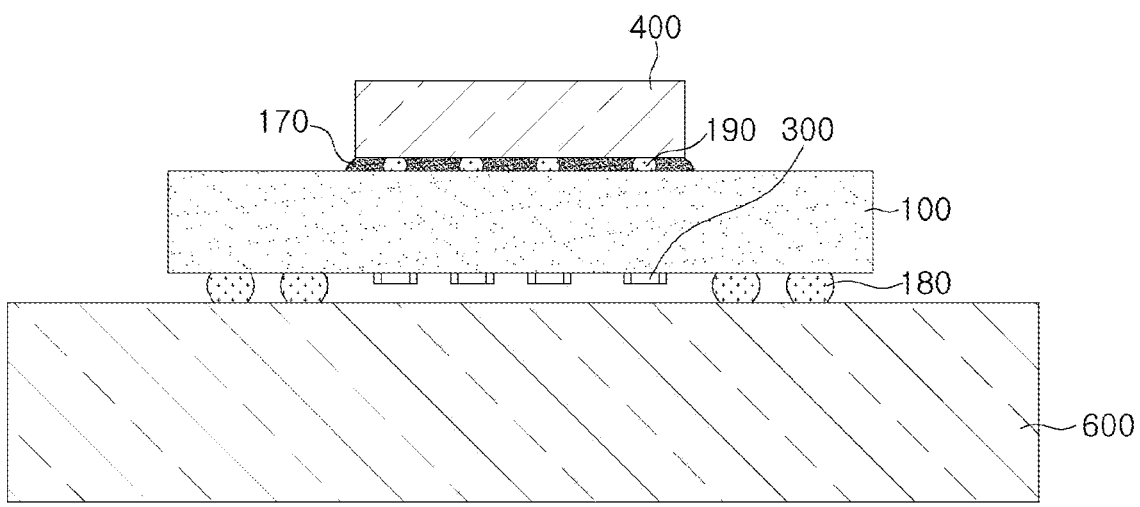
FIG. 6 is a schematic cross-sectional view illustrating an example of an electronic device including the substrate structure shown in FIG. 3.

FIG. 6 is a schematic cross-sectional view illustrating an example of an electronic device including the substrate structure shown in FIG. 3.

Referring to FIG. 6, an electronic device 800A according to an example includes a mainboard 600, a printed circuit board 100 disposed on the mainboard 600, a semiconductor chip 400 disposed on an upper side of the printed circuit board 100, and a plurality of passive components 300 disposed on a lower side of the printed circuit board 100. The printed circuit board 100 may be connected to the mainboard 600 through a plurality of first connection metals 180. The semiconductor chip 400 may be connected to the printed circuit board 100 through a plurality of second connection metals 190. An underfill resin 170 may be disposed between the printed circuit board 100 and the semiconductor chip 400 to cover at least a portion of the plurality of second connection metals 190. In the following description, most of the same contents as described above will be omitted to avoid duplicate description.

The mainboard 600 provides a physical and/or electrical connection path and a disposition place of various electronic components in the electronic device 800A. The mainboard 600 may be of any among various types of printed circuit boards. The mainboard 600 may be a multilayer printed circuit board (a multilayer PCB). The mainboard 600 may be a rigid PCB or a rigid-flexible PCB. Various types of electronic components may be embedded in the mainboard 600. In addition to the above-described substrate structure, various electronic components may be disposed on the mainboard 600.

The semiconductor chip 400 may be an integrated circuit (IC) providing an amount of several hundreds to several millions of elements or more integrated in a single chip. An integrated circuit, constituting the semiconductor chip 400, may be, for example, an application processor chip, but is not limited thereto. The semiconductor chip 400 may be an integrated circuit in a bare state in which an additional bump or wiring layer is not formed. However, the semiconductor chip 400 is not limited thereto and, as appropriate, may be a packaged-type integrated circuit. The integrated circuit may be formed based on an active wafer. In this case, a base material of a body of the semiconductor chip 400 may be silicon (Si), germanium (Ge), gallium arsenide (GaAs), or the like. Various circuits may be formed on the body. The semiconductor chip 400 may be connected to other elements through a connection pad, and a material of the connection pad may be any metal material such as copper (Cu), aluminum (Al), or the like. A passivation layer, not illustrated, may be formed on the body to expose the connection pad, and may be an oxide layer, a nitride layer, or the like, or a double layer of an oxide layer and a nitride layer. An insulating layer, or the like, may be further disposed in other locations. In the semiconductor chip 400, a surface on which a connection pad is disposed may be an active surface, and a rear surface opposing the active surface may be an inactive surface. However, according to cases, the connection pad may also be disposed on the rear surface, such that both surfaces may be active surfaces.

Figure 7:
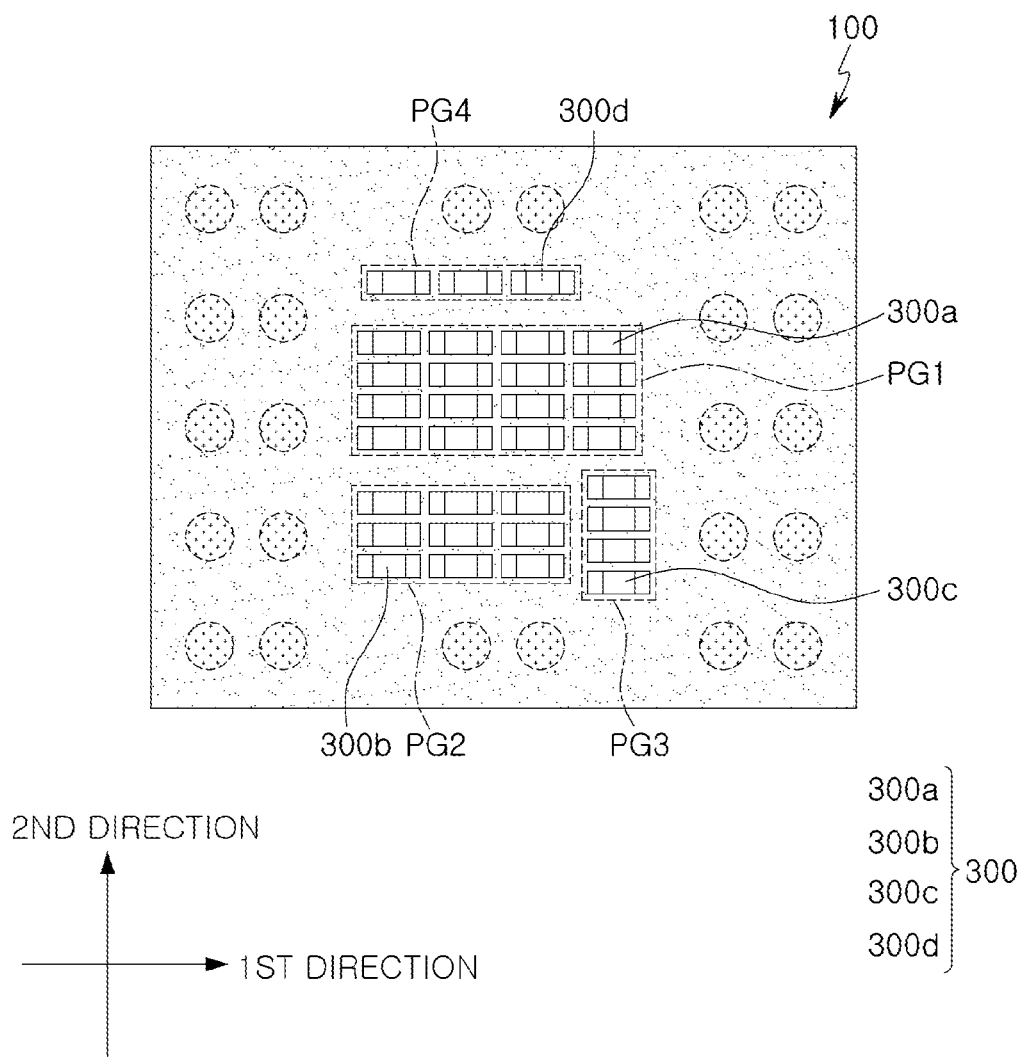
FIG. 7 is a schematic plan view illustrating a lower side of a printed circuit board of the electronic device shown in FIG. 6.

FIG. 7 is a schematic plan view illustrating a lower side of a printed circuit board 100 of the electronic device shown in FIG. 6.

Referring to FIG. 7, a plurality of passive components 300 include a first group PG1 including a plurality of first passive components 300a adjacent to each other, a second group PG2 including a plurality of second passive components 300b adjacent to each other, a third group PG3 including a plurality of third passive components 300c adjacent to each other, and a fourth group PG4 including a plurality of fourth passive components 300d adjacent to each other. The number of groups among the first group PG1 to the fourth group PG4 may be adjusted. For example, the plurality of passive components 300 may include fewer groups than those illustrated in the drawings, or may include more groups than those illustrated in the drawings. Most of the details thereof are the same as described above, and detailed descriptions thereof are omitted.

Figure 8:
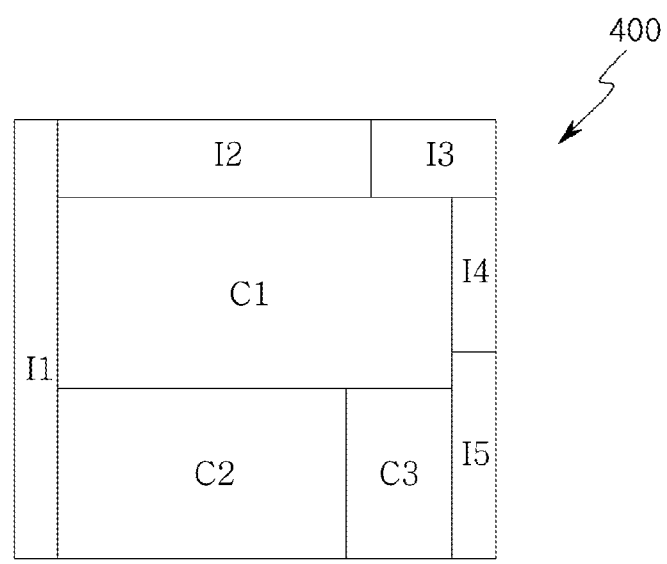
FIG. 8 is a schematic plan view illustrating a disposition of functional circuits inside of the substrate structure of the electronic device shown in FIG. 6.

FIG. 8 is a schematic plan view illustrating a disposition of functional circuits (e.g., functional circuit units) inside of the substrate structure of the electronic device in FIG. 6.

Referring to FIG. 8, a semiconductor chip 400 includes a plurality of functional circuits (e.g., functional circuit units) C1, C2, C3, I1, I2, I3, I4, and I5. For example, the semiconductor chip 400 may include one or more core functional circuit unit(s) C1, C2, and C3 and one or more input/output functional circuit unit (s) (interface units) I1, I2, I3, I4, and I5. However, the present disclosure is not limited thereto, and the semiconductor chip 400 may further include an interface unit, a memory unit, and the like. The core functional circuits C1, C2, and C3 may include at least one of a central processing unit (CPU), a graphics processing unit (GPU), a digital signal processor unit (DSPU), an image signal processing unit (ISPU), and a neural processing unit (NPU). The semiconductor chip 400 including such internal units may be, for example, an application processor chip, but is not limited thereto. Most of the other contents are substantially the same as described above, and thus, duplicate descriptions are omitted.

Figure 9:
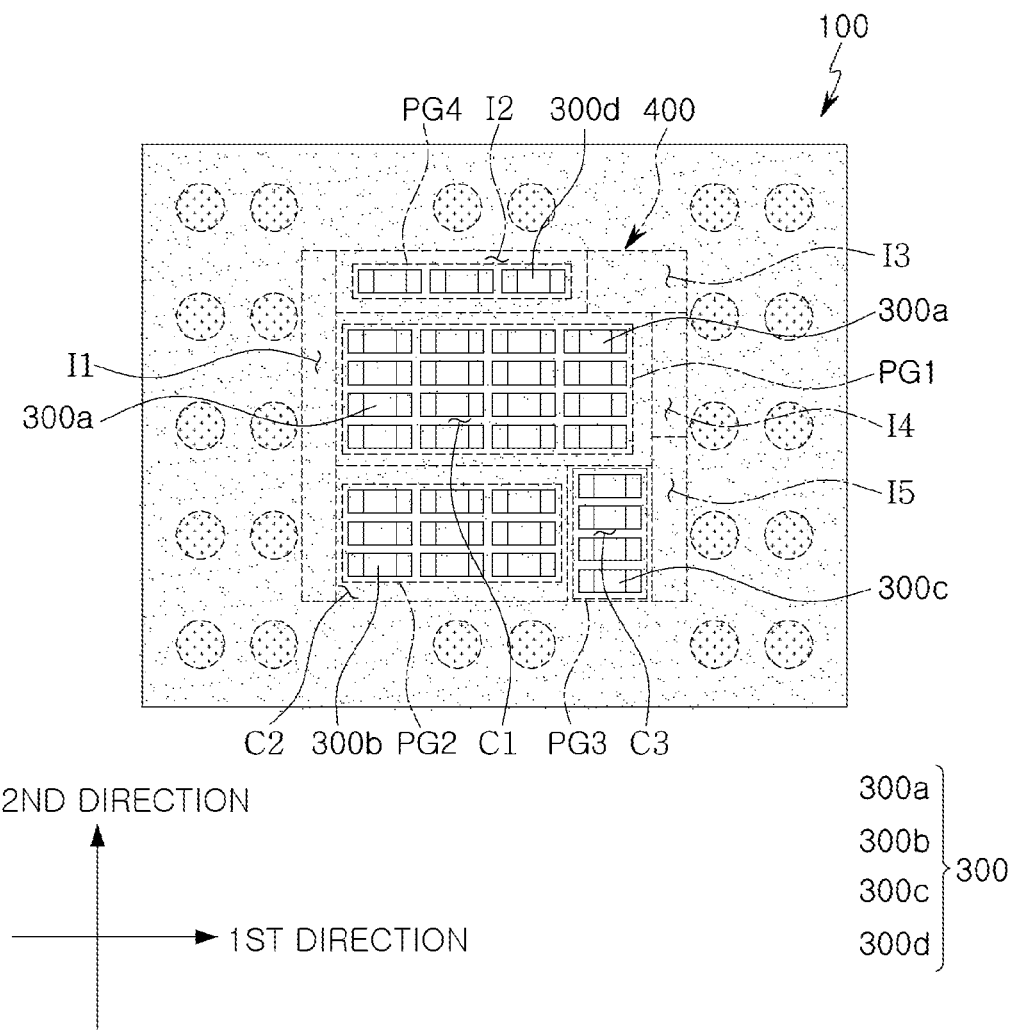
FIG. 9 is a schematic plan view depicting that passive components on a lower side of a first printed circuit board shown in FIG. 7 and functional circuits inside of the semiconductor chip shown in FIG. 8 overlap each other.

FIG. 9 is a schematic plan view provided such that a lower side of a first printed circuit board shown in FIG. 7 and functional circuits inside of the semiconductor chip shown in FIG. 8 are disposed to overlap each other.

Referring to FIG. 9, at least a portion of a plurality of passive components 300a, 300b, 300c, and 300d grouped into groups PG1, PG2, PG3, and PG4 of a plurality of passive components 300 may be disposed to overlap at least one of the plurality of functional circuit units C1, C2, C3, I1, I2, I3, I4, and I5 of the semiconductor chip 400, when viewed from above. For example, the first group PG1 may be disposed directly below the first core functional circuit unit C1 (e.g., all passive components of the first group PG1 may be disposed directly below the first core functional circuit C1, and/or no components of any group other than the first group PG1 may be disposed directly below the first core functional circuit C1). The second group PG2 may be disposed directly below the second core functional circuit unit C2 (e.g., all passive components of the second group PG2 may be disposed directly below the second core functional circuit C2, and/or no components of any group other than the second group PG2 may be disposed directly below the second core functional circuit C2). The third group PG3 may be disposed directly below the third core functional circuit unit C3 (e.g., all passive components of the third group PG3 may be disposed directly below the third core functional circuit C3, and/or no components of any group other than the third group PG3 may be disposed directly below the third core functional circuit C3). As described above, when a plurality of passive components 300a, 300b, and 300c grouped into the groups PG1, PG2, and PG3 are disposed directly below the core functional circuit units C1, C2, and C3, respectively, a better power integrity improvement effect may be obtained. Additionally, the fourth group PG4 may be disposed directly below an input/output functional circuit unit I2 having a relatively larger planar area than each of the other input/output functional circuit units I1, I3, I4, and I5 (e.g., all passive components of the fourth group PG4 may be disposed directly below the input/output functional circuit unit I2, and/or no components of any group other than the fourth group PG4 may be disposed directly below the input/output functional circuit unit I2). Most of the other contents are substantially the same as described above, and thus, duplicate descriptions are omitted.

In one example, the first group PG1 may be disposed directly below the first core functional circuit unit C1, and passive components of the first group PG1 may be electrically connected to circuitry of the first core functional circuit C1 (e.g., via one or more pads disposed directly below the first core functional circuit C1). The second group PG2 may be disposed directly below the second core functional circuit C2, and passive components of the second group PG2 may be electrically connected to circuitry of the second core functional circuit C2 (e.g., via one or more pads disposed directly below the second core functional circuit C2). The third group PG3 may be disposed directly below the third core functional circuit C3, and passive components of the third group PG3 may be electrically connected to circuitry of the third core functional circuit C3 (e.g., via one or more pads disposed directly below the third core functional circuit C3). As described above, when a plurality of passive components 300a, 300b, and 300c grouped into the groups PG1, PG2, and PG3 are disposed directly below the core functional circuits C1, C2, and C3 to which they are electrically connected, a better power integrity improvement effect may be obtained. Additionally, the fourth group PG4 may be disposed directly below an input/output functional circuit I2 having a relatively larger area than each of the other input/output functional circuits I1, I3, I4, and I5, and passive components of the fourth group PG4 may be electrically connected to circuitry of the input/output functional circuit I2 (e.g., via one or more pads disposed directly below the input/output functional circuit I2).

Figure 10:
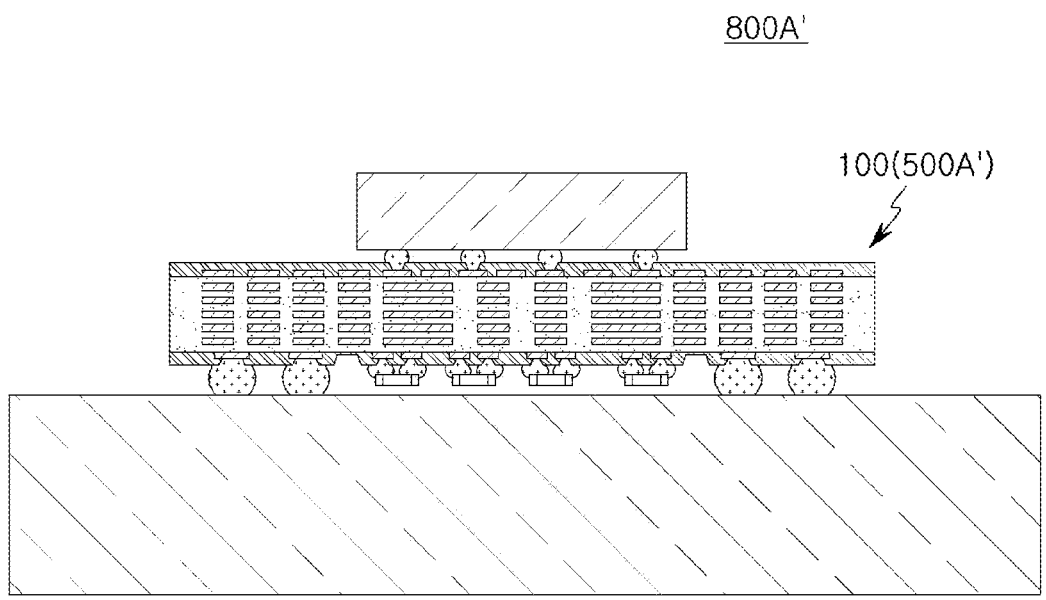
FIG. 10 is a schematic cross-sectional view illustrating a modified example of the electronic device shown in FIG. 6.

FIG. 10 is a schematic cross-sectional view illustrating a modified example of the electronic device shown in FIG. 6.

Referring to FIG. 10, an electronic device 800A' according to a modified example includes a substrate structure 500A' according to the modified example. For example, a printed circuit board 100 may be a core-type printed circuit board including a multilayer core layer. Most of the other contents are substantially the same as described above, and thus, duplicate descriptions are omitted.

Figure 11:
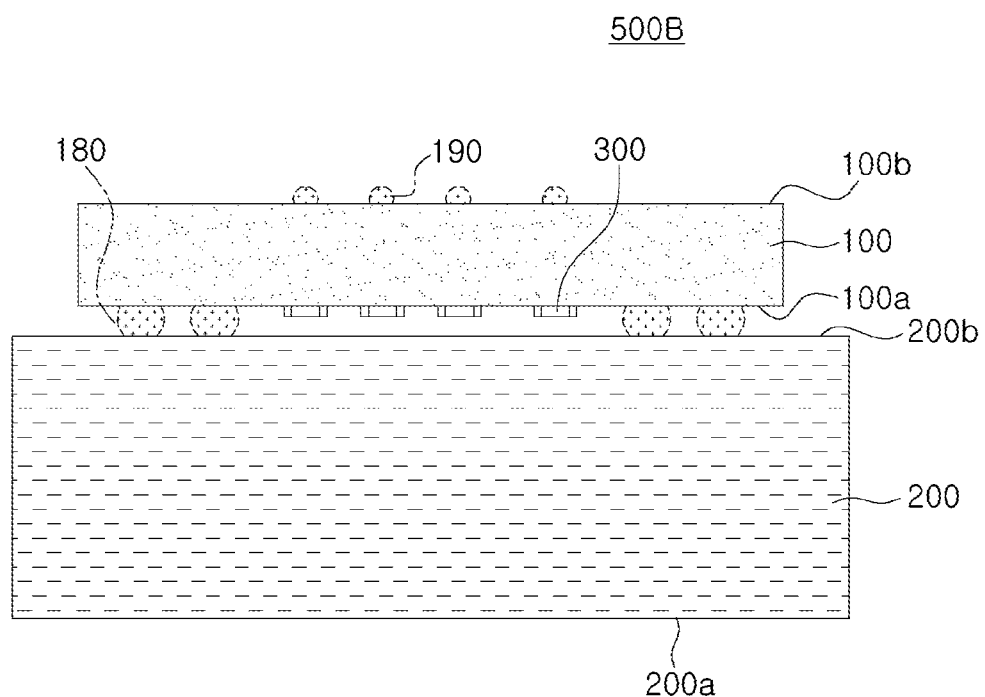
FIG. 11 is a schematic cross-sectional view illustrating another example of a substrate structure.

FIG. 11 is a schematic cross-sectional view illustrating another example of a substrate structure.

Figure 12:
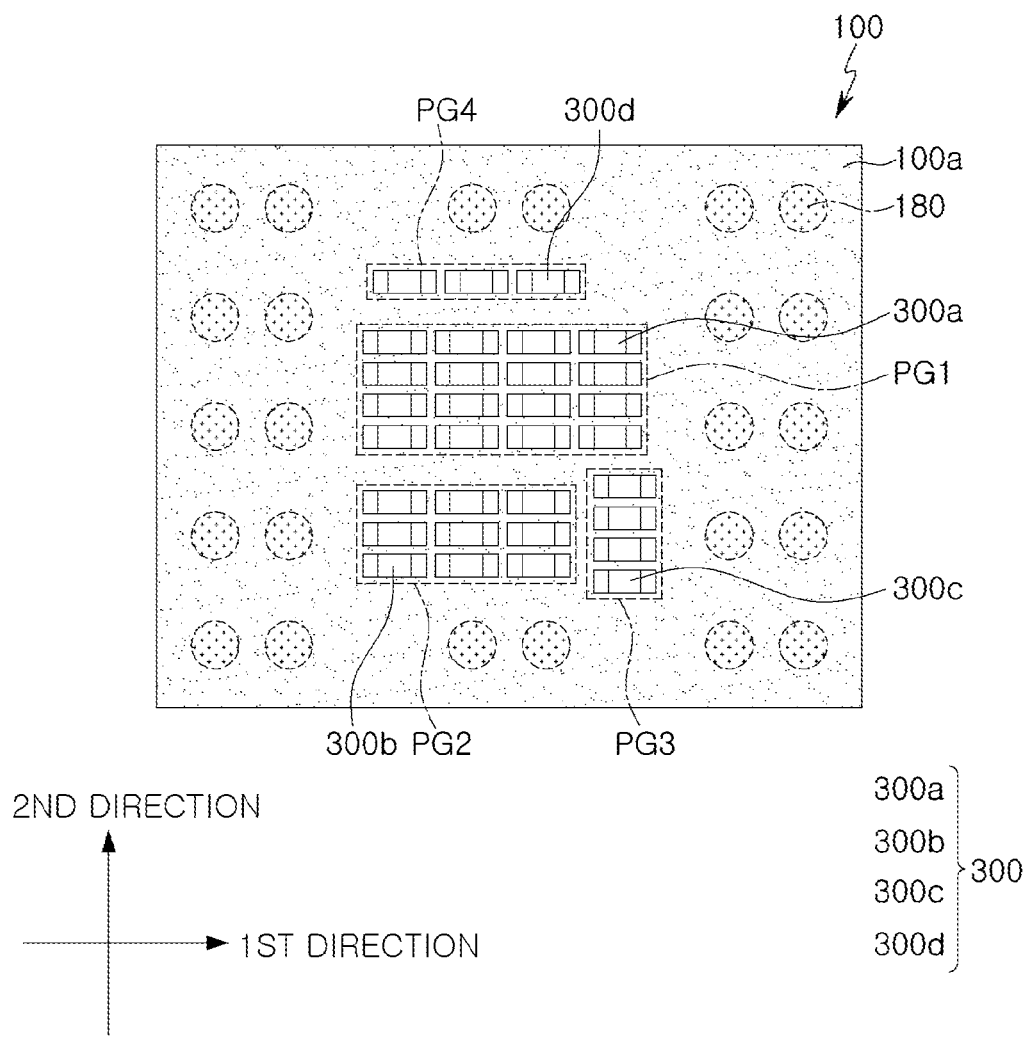
FIG. 12 is a schematic plan view illustrating a lower side of a first printed circuit board of the substrate structure shown in FIG. 11.

FIG. 12 is a schematic plan view illustrating a lower side of a first printed circuit board of the substrate structure in FIG. 11.

Referring to FIGS. 11 and 12, a substrate structure 500B according to another example includes a second printed circuit board 200 having third and fourth sides 200a and 200b opposing each other, a first printed circuit board 100 disposed on a fourth side 200b of the second printed circuit board 200 and having first and second sides 100a and 100b opposing each other, and a plurality of passive components 300 disposed between the fourth side 200b of the second printed circuit board 200 and the first side 100a of the first printed circuit board 100 and connected to the first side 100a of the first printed circuit board 100. The substrate structure 500B according to another example may have a substrate-on-substrate structure and may function as a package substrate. Hereinafter, description of structures similar to those previously described above will be omitted to reduce repetition.

As described above, the substrate structure 500B according to another example has a structure in which the first and second printed circuit boards 100 and 200 are stacked, to satisfy demand for a high-multilayer and large-scale substrate. Therefore, as compared with the case in which a high-multilayer and large-scale substrate is manufactured through only a single printed circuit board, technical difficulty may be lowered and yield may be increased. As a result, costs may be reduced. Moreover, wiring designs of the first printed circuit board 100 and the second printed circuit board 200 are different from each other, and thus, an optimized wiring design may be implemented. As a result, better performance may be obtained.

In addition, a substrate structure 500B according to another example includes a plurality of passive components 300 disposed between first and second printed circuit boards 100 and 200. The plurality of passive components 300 may be, for example, LSCs connected to one side 100a of the first printed circuit board 100, and thus, integrity may be improved. When such an LSC is used, a size of the first printed circuit board 100 may be additionally reduced, as compared with a DSC. In addition, since a distance from a semiconductor chip, disposed on the first printed circuit board 100, may be short as compared with that of the DSC, a better power integrity improvement effect may be obtained.

The plurality of passive components 300 includes a first group PG1 including a plurality of first passive components 300a disposed adjacent to each other, a second group PG2 including a plurality of second passive components 300b disposed adjacent to each other, a third group PG3 including a plurality of third passive components 300c disposed adjacent to each other, and a fourth group PG4 including a plurality of fourth passive components 300d disposed adjacent to each other. The number of groups among the first to fourth groups PG1 to PG4 may be adjusted as appropriate. For example, the plurality of passive components 300 may include fewer groups than those illustrated in the drawings, or may include more groups than those illustrated in the drawings.

When a plurality of passive components 300 includes a plurality of passive components 300a, 300b, 300c, and 300d which may be grouped into a plurality of groups PG1, PG2, PG3, and PG4, the plurality of passive components 300a, 300b, 300c, and 300d may be selectively disposed on a plane to overlap a plurality of functional circuit units (e.g., to overlap respective units of a plurality of units) inside of a semiconductor chip 400 disposed on the printed circuit board 100, as will be described below. For example, each of the passive components 300a, 300b, 300c, and 300d, grouped into groups PG1, PG2, PG3, and PG4, may be disposed directly below a main core unit or a specific input/output unit of a semiconductor chip. Thus, a better power integrity improvement effect may be obtained.

The second printed circuit board 200 may have a larger scale than the first printed circuit board 100. For example, the second printed circuit board 200 may have a higher thickness than the first printed circuit board 100. In addition, the second printed circuit board 200 may have a larger planar area than the first printed circuit board 100. In a non-limiting example, the second printed circuit board 200 may be a high-density interconnection (HDI) interposer substrate, and the first printed circuit board 100 may be a flip-chip ball grid array (FCBGA) substrate. The wiring layer in the first printed circuit board 100 may mainly serve to transmit a signal, and the wiring layer in the second printed circuit board 200 may mainly provide power and grounding.

The substrate structure 500B according to another example may further include a plurality of first connection metals 180 disposed between a fourth side 200b of the second printed circuit board 200 and a first side 100a of the first printed circuit board 100 to connect the fourth side 200b of the second printed circuit board 200 and the first side 100a of the first printed circuit board 100 to each other. The plurality of first connection metals 180 may surround the first to fourth groups PG1, PG2, PG3, and PG4. In addition, the substrate structure 500B may further include a second connection metal (e.g., 190) disposed on the second side 100b of the first printed circuit board 100 to be connected thereto. As will be described later, a semiconductor chip, or the like, may be disposed on the second side 100b of the first printed circuit board 100 through a plurality of second connection metals 190 in a surface-mounted form. At least a portion of the plurality of second connection metals 190 may be disposed to overlap at least a portion of the plurality of passive components 300, when viewed from above.

The substrate structure 500B according to another example may further include a plurality of third connection metals 290 (see, e.g., FIG. 13) disposed on the third side of the second printed circuit board 200. As described later, the substrate structure 500B may be disposed on a mainboard, or the like, to be connected thereto. Each of the third connections metal 290 may also include a low melting point metal having a lower melting point than copper (Cu), for example, tin (Sn) or a tin-containing alloy. For example, each of the third connection metals 290 may be formed of a solder, but the present disclosure is not limited thereto. Each of the third connection metals 290 may also be a land, a ball, a pin, or the like, and may have a multilayer structure or a single-layer structure. When having a multilayer structure, each of the third connection metals 290 may include a copper pillar and solder. When having a single-layer structure, each of the third connection metals 290 may include a tin-silver solder, but this is only an example and the present disclosure is not limited thereto.

Optionally, the substrate structure 500B according to another example may further include an underfill resin 160 (see, e.g., FIG. 15) disposed between the first side 100a of the first printed circuit board 100 and the fourth side 200b of the second printed circuit board 200 and covering at least a portion of the plurality of first connection metals 180. A material of the underfill resin 160 may be an insulating adhesive such as an epoxy resin, but is not limited thereto. Other materials, each functioning as an underfill, may be used as the material of the underfill resin 160.

Figure 13:
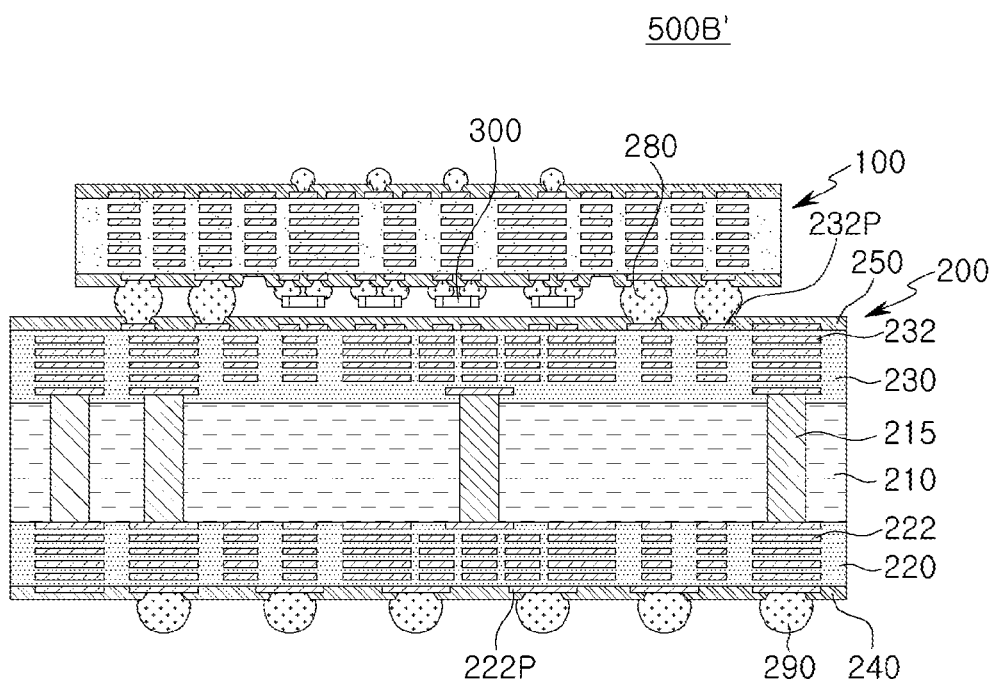
FIG. 13 is a schematic cross-sectional view illustrating a modified example of the substrate structure shown in FIG. 11.

FIG. 13 is a schematic cross-sectional view illustrating a modified example of the substrate structure in FIG. 11.

Referring to FIG. 13, in a substrate structure 500B' according to a modified example, a first printed circuit board 100 may be a coreless printed circuit board. In addition, a second printed circuit board 200 may also be a core-type printed circuit board. When the first printed circuit board 100 is a careless printed circuit board, the first connection metal 280 does not need to have a fine pitch. Therefore, since a general LSC, rather than an LSC having a low profile, may be used as each of the plurality of passive components 300, costs may be reduced. When the second printed circuit board 200 is a core-type printed circuit board, it may be more advantageous in terms of warpage control of the substrate structure 500B'. In addition, it may be more advantageous to provide a plurality of passive components 300. In addition, it may be more advantageous in implementing a high-density interconnection (HDI). Hereinafter, most of the other contents are substantially the same as described above, and thus, duplicate descriptions are omitted.

The printed circuit board 200 may include a core layer 210, a first build-up layer 220 disposed on a lower side of the core layer 210, a second build-up layer 230 disposed on an upper side of the core layer 210, a plurality of first wiring layers 222 embedded in the first build-up layer 220, a plurality of second wiring layers 232 embedded in the second build-up layer 230, and a plurality of through-vias 215 penetrating through the core layer 210 and electrically connecting the plurality of first wiring layers 222 and the plurality of second wiring layers 232. The plurality of passive components 300 may be disposed on a lower surface of the first printed circuit board 100, between the first and second printed circuit boards 100 and 200. The plurality of passive components 300 may be electrically connected to the plurality of second wiring layers 232 through connection vias penetrating through a portion of a core layer of the first circuit board 100, the first connection metals 280 connecting the first and second printed circuit boards 100 and 200, and the connection pads 232P. Vertically adjacent layers, disposed above and below each of the plurality of first wiring layers 222 and the plurality of second wiring layers 232, may be connected to each other through a plurality of vias penetrating through the first and second build-up layers 220 and 230. A third passivation layer 240 may be disposed on the first build-up layer 220. A fourth passivation layer 250 may be disposed on the second build-up layer 230. The third passivation layer 240 may have a plurality of third openings, respectively exposing a plurality third pads 222P. A third connection metal 290 may be disposed on each of the third openings to be connected to a respective first pad 222P. The fourth passivation layer 250 may have a plurality of fourth openings, respectively exposing the plurality of fourth pads 232P. A first connection metal 280 may be disposed on each of the fourth openings to be connected to a respective fourth pad 232P. The second printed circuit board 200 may not necessarily be a core-type printed circuit board, and may be a coreless printed circuit board, as appropriate.

The core layer 210 may be a core substrate, a center of the second printed circuit board 200. A material of the core layer 210 may be an insulating material. The insulating material may be a thermosetting resin such as an epoxy resin, a thermoplastic resin such as polyimide, or a material including the thermosetting resin and the thermoplastic resin, a glass fiber (or a glass cloth or a glass fabric an inorganic filler, and/or a reinforcing material such as an inorganic filler, for example, a copper clad laminate (CCL), an unclad CCL, or the like. However, the material of the first and second insulating layers 111a and 111b is not limited thereto, and may be a metal plate or a glass plate, or may be a ceramic plate. Optionally, the material of the core layer 210 may be a liquid crystal polymer (LCP). The core layer 210 may have a higher thickness than each of the insulating layers, respectively constituting the build-up layers 220 and 230, for the purpose of warpage control, or the like. In addition, the core layer 210 may have greater rigidity than each of the insulating layers, respectively constituting the build-up layers 220 and 230, for the purpose of warpage control, or the like. For example, the core layer 210 may have a greater elastic modulus than each of the insulating layers.

The build-up layers 220 and 230 may provide an insulating region for forming a multilayer wiring on opposite sides adjacent to the core layer 210. Each of the build-up layers 220 and 230 may include a plurality of insulating layers, and boundaries between the plurality of insulating layers may be apparent or may not be apparent. A material of the insulating layers may be an insulating material. In this case, the insulating material may be a thermosetting resin such as an epoxy resin, a thermoplastic resin such as polyimide, or a material including the thermosetting resin and the thermoplastic resin, a glass fiber, and/or a reinforcing material such as an inorganic filler, for example, prepreg, an Ajinomoto Build-up Film (ABF), or the like. Optionally, the material of the insulating layers may be a photoimageable dielectric (PID). On the other hand, build-up layers 220 and 230 may include the same material, or may include materials different from each other.

The wiring layers 222 and 232 may include a metal material such as copper (Cu), aluminum (Al), silver (Ag), tin (Sn), gold (Au), nickel (Ni), lead (Pb), titanium (Ti), or alloys thereof. Each of the wiring layers 222 and 232 may be formed by a process such as an additive process (AP), a semi-AP (SAP), a modified SAP (MSAP), a tenting (TT) process, or the like. As a result, each of the wiring layers 222 and 232 may include a seed layer, serving as an electroless plating layer, and an electrolytic plating layer formed based on the seed layer. The wiring layers 222 and 232 may perform various functions depending on designs thereof. For example, each of the wiring layers 222 and 232 may include a ground pattern, a power pattern, a signal pattern, and the like. The signal pattern may include various signals, other than a ground pattern, a power pattern, and the like, such as a data signal, and the like. Each pattern may include a line pattern, a plane pattern, and/or a pad pattern. A via, including a connection via connected to the wiring layers 222 and 232, may also include a metal material. The via may also be formed by a plating process such as an AP, an SAP, an MSAP, and a TT process. The via may also perform various functions depending on a design thereof. For example, the via may include a wiring via for signal connection, a wiring via for a ground connection, a wiring via for power connection, and the like. The via may be completely filled with a metal material, or a metal material may be formed along a wall of a via hole. In addition, various shapes, such as a tapered shape and the like, may be applied to the via.

The through-via 215 may penetrate through the core layer 210 and may connect the wiring layers 222 and 232, respectively disposed on a lower side and an upper side of the core layer 210, to each other. The through-via 215 may include a metal material such as copper (Cu), aluminum (Al), silver (Ag), tin (Sn), gold (Au), nickel (Ni), lead (Pb), titanium (Ti), or alloys thereof. The through-via 215 may also be formed by an AP, a SAP, a MSAP, a TT process, or the like. As a result, the through-via 215 may include a seed layer, serving as an electroless plating layer, and an electrolytic plating layer formed based on the seed layer. The through-via 215 may include a via for signal connection, a via for a ground connection, a via for power connection, and the like. The through-via 215 may have various shapes such as a cylindrical shape, an hourglass shape, and the like. Optionally, the through-via 215 may be filled with an insulating material.

The passivation layers 240 and 250 are additional elements, and may protect an internal structure of the printed circuit board 200 from external physical and chemical damages. Each of the passivation layers 240 and 250 may include a thermosetting resin. For example, each of the passivation layers 240 and 250 may be an ABF. However, the present disclosure is not limited thereto, and each of the passivation layers 240 and 250 may be a solder resist (SR) layer. Optionally, each of the passivation layers 240 and 250 may include a PID. Each of the passivation layers 240 and 250 may have a plurality of openings. A surface treatment layer may be formed on surfaces of the pads 222P and 232P exposed through the plurality of openings. The surface treatment layer may be formed by, for example, electrolytic gold plating, electroless gold plating, organic solderability preservative (OSP) or electroless tinplating, electroless silver plating, electroless nickel plating/substitution gold plating, direct immersion gold (DIG) plating, hot air solder leveling (HASL), or the like. Optionally, the openings may be a plurality of via holes. Optionally, an underbump metal (UBM) may be disposed on each of the openings to improve reliability.

The third connection metals 290 are additional elements which may physically and/or electrically connect the printed circuit board 200 to an external entity. For example, the printed circuit board 200 may be mounted on another mainboard, or the like, through the third connection metals 290. Each of the third connection metals 290 may be disposed on a respective opening of the plurality of openings of the passivation layers 240 and 250, respectively. The third connection metals 290 may include a low melting point metal, having a lower melting point than copper (Cu), such as tin (Sn) or a tin-containing alloy. For example, the third connection metals 290 may be formed of a solder. However, this is only an example and the material of the third connection metals 290 is not limited thereto.

The third connection metal 290 may be a land, a ball, a pin, or the like. The third connection metal 290 may have a multilayer structure or a single-layer structure. When having a multilayer structure, the third connection metal 290 may include a copper pillar and a solder. When having a single-layer structure, the third connection metal 290 may include a tin-silver solder. However, this is only an example and the present disclosure is not limited thereto. The number, an interval, a disposition form, and the like, of the connection metals 280 and 290 are not necessarily limited, and may be sufficiently modified depending on designs particulars.

Figure 14:
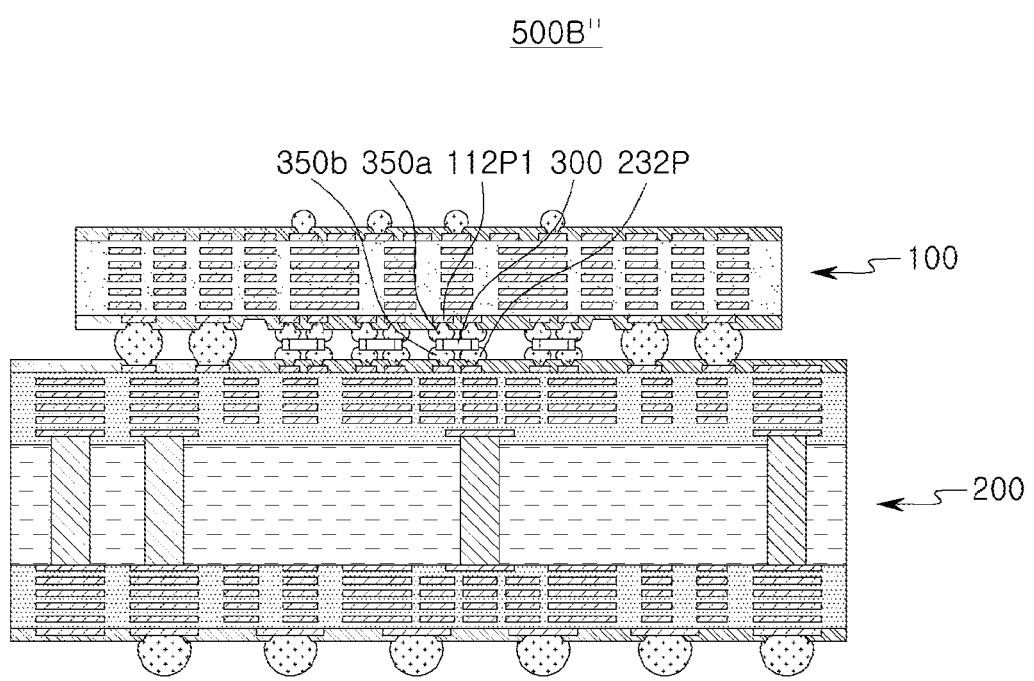
FIG. 14 is a schematic cross-sectional view illustrating a modified example of the substrate structure shown in FIG. 11.

FIG. 14 is a schematic cross-sectional view illustrating a modified example of the substrate structure in FIG. 11.

Referring to FIG. 14, a substrate structure 500B" according to a modified example includes a passive component 300 which is also connected to a second printed circuit board 200 in the above-described substrate structure 500B'. For example, the passive component 300 may be connected to both a first pad 112P1 on a lower side of the first printed circuit board 100 through a first conductive adhesive 350a, and may also be connected to a fourth pad 232P on an upper side of the second printed circuit board 200 through a second conductive adhesive 350b. Accordingly, a power transfer path may be further reduced, and power integrity may be more effectively improved. Most of the other contents are substantially the same as described above, and thus, duplicate descriptions are omitted.

Figure 15:
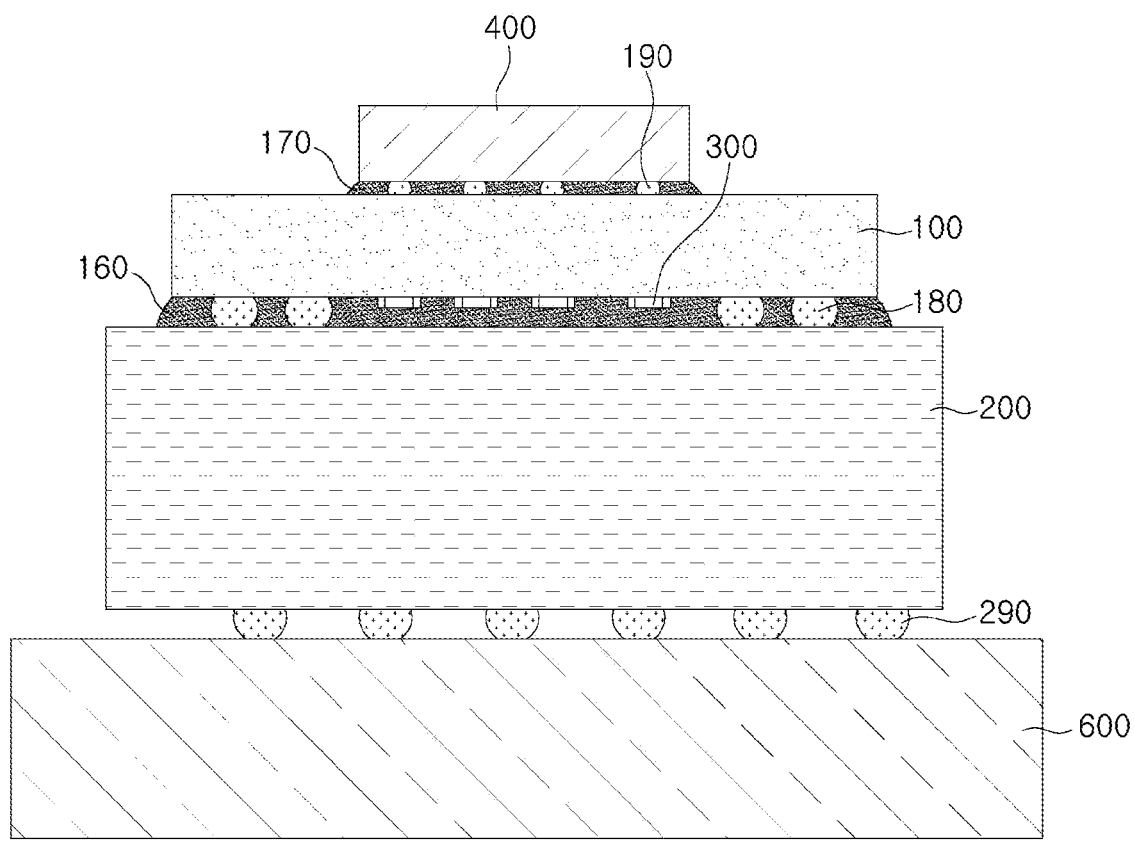
FIG. 15 is a schematic cross-sectional view illustrating another example of an electronic device including the substrate structure shown in FIG. 11.

FIG. 15 is a schematic cross-sectional view illustrating another example of an electronic device including the substrate structure in FIG. 11.

Referring to FIG. 15, an electronic device 800B according to another example includes a mainboard 600, a first printed circuit board 100 disposed on the mainboard 600, a second printed circuit board 200 disposed between the mainboard 600 and the first circuit board 100, a plurality of passive components 300 disposed between the first and second printed circuit boards 100 and 200, and a semiconductor chip 400 disposed on the first printed circuit board 100. The first and second printed circuit boards 100 and 200 may be connected through a plurality of first connection metals 180. The semiconductor chip 400 may be surface-mounted on the first printed circuit board 100 through a plurality of second connection metals 190. The first printed circuit board 100 may be connected to the second printed circuit board 200 through a plurality of first connection metals 180. The second printed circuit board 200 may be connected to the mainboard 600 through a plurality of third connection metals 290. A first underfill resin 160 may be disposed between the first printed circuit board 100 and the second printed circuit board 200 to cover at least a portion of each of the plurality of first connection metals 180 and the plurality of passive components 300. An underfill resin 170 may be disposed between the first printed circuit board 100 and the semiconductor chip 400 to cover at least a portion of the plurality of second connection metals 190. Most of the other contents are substantially the same as described above, and thus, duplicate descriptions are omitted.

Figure 16:
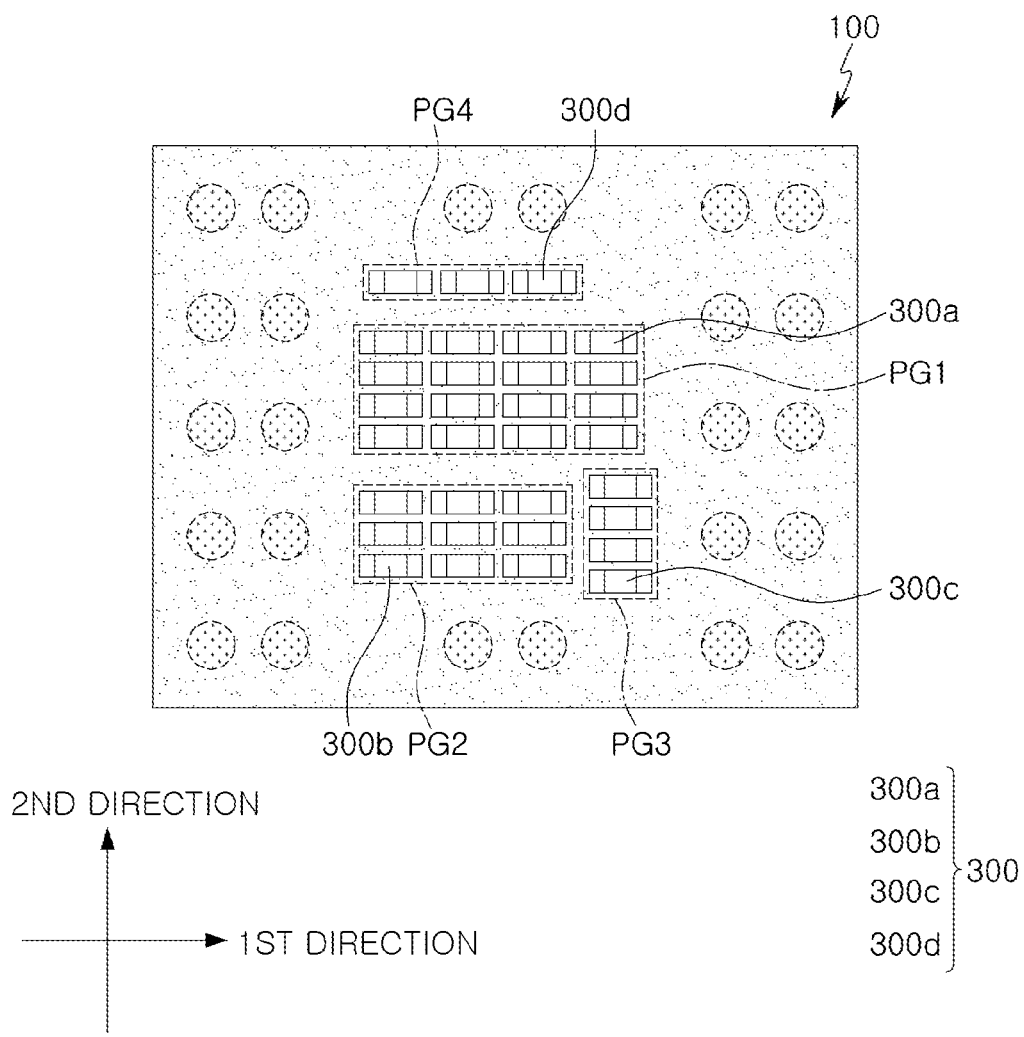
FIG. 16 is a schematic plan view illustrating a lower side of a first printed circuit board of the substrate structure of the electronic device shown in FIG. 15.

FIG. 16 is a schematic plan view illustrating a lower side of a first printed circuit board of the substrate structure of the electronic device shown in FIG. 15.

Referring to FIG. 16, a plurality of passive components 300 include a first group PG1 including a plurality of first passive components 300a disposed adjacent to each other, a second group PG2 including a plurality of second passive components 300b disposed adjacent to each other, a third group PG3 including a plurality of third passive components 300c disposed adjacent to each other, and a fourth group PG4 including a plurality of fourth passive components 300d disposed adjacent to each other. The number of groups among the first to fourth groups PG4 may be adjusted, as appropriate. For example, the plurality of passive components 300 may include fewer groups than that those illustrated in the drawing, or may include more groups than those illustrated in the drawing. Most of the details thereof are the same as described above, and detailed description thereof is omitted.

Figure 17:
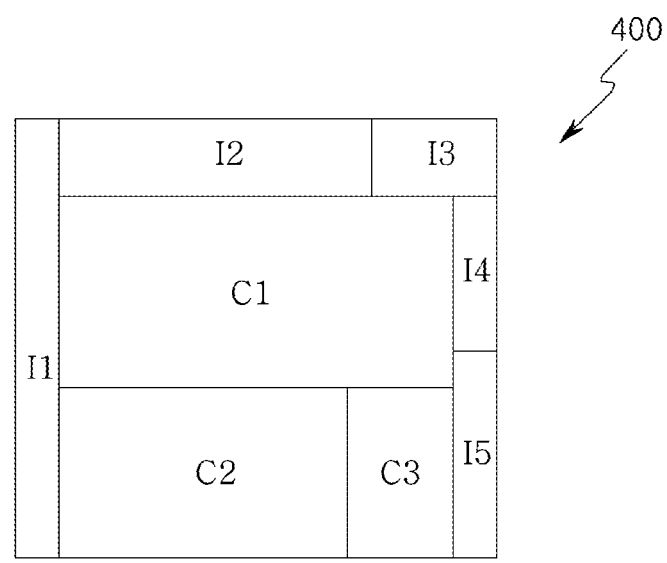
FIG. 17 is a schematic plan view illustrating a disposition of functional circuits inside of a semiconductor chip of the electronic device shown in FIG. 15.

FIG. 17 is a schematic plan view illustrating a disposition of functional circuits inside of a semiconductor chip of the electronic device shown in FIG. 15.

Referring to FIG. 17, a semiconductor chip 400 includes a plurality of functional circuits C1, C2, C3, I1, I2, I3, I4, and I5. For example, the semiconductor chip 400 may include one or more core functional circuit unit(s) C1, C2, and C3 and one or more input/output functional circuit unit(s) (interface unit(s)) I1, I2, I3, I4, and I5. However, the present disclosure is not limited thereto, and the semiconductor chip 400 may further include an interface unit, a memory unit, and the like. The core functional circuit units C1, C2, and C3 may include at least one of a central processing unit (CPU), a graphics processing unit (GPU), a digital signal processor unit (DSPU), an image signal processing unit (ISPU), and a neural processing unit (NPU). The semiconductor chip 400 including such internal functional circuit units may be, for example, an application processor chip, but is not limited thereto. Most of the other contents are substantially the same as described above, and thus, duplicate descriptions are omitted.

Figure 18:
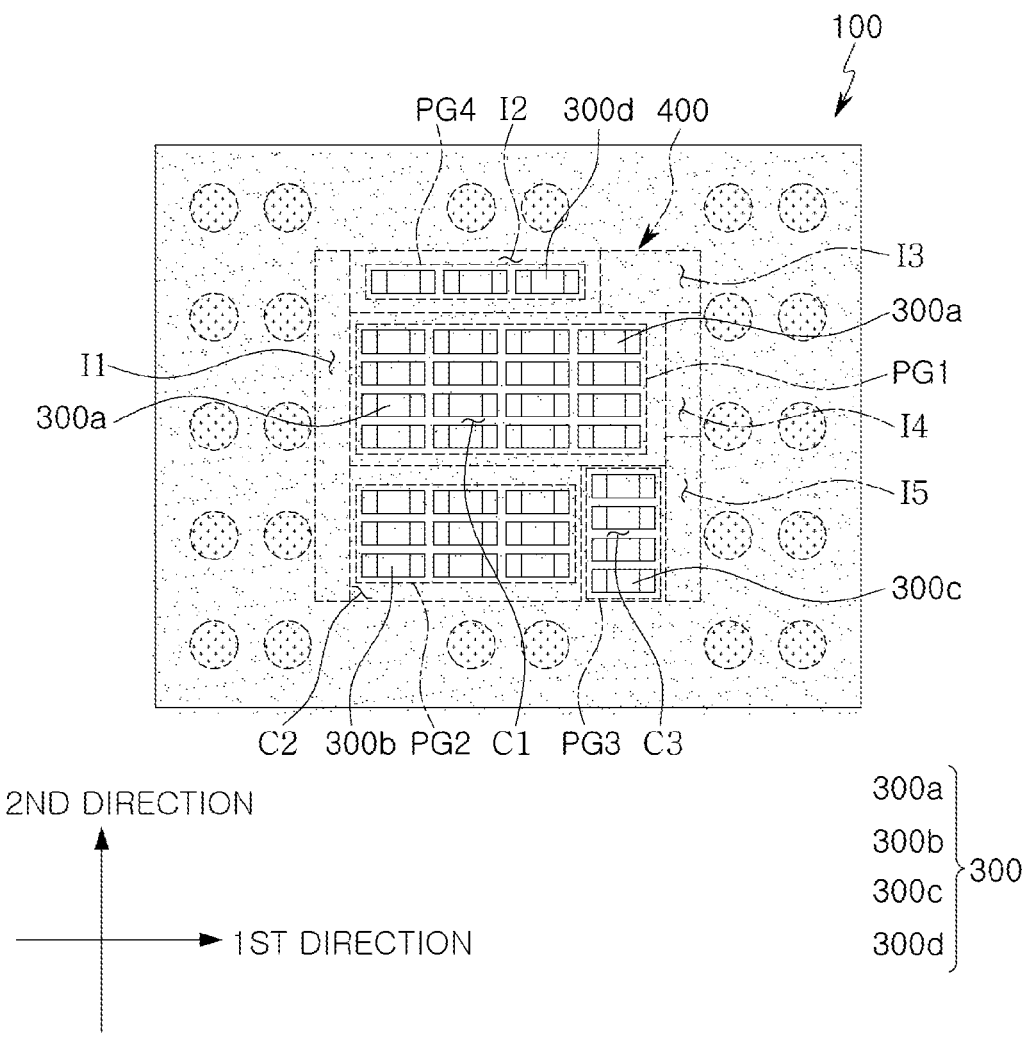
FIG. 18 is a schematic plan view depicting that passive components on a lower side of a first printed circuit board shown in FIG. 16 and functional circuits inside of the semiconductor chip shown in FIG. 17 overlap each other.

FIG. 18 is a schematic plan view provided such that a lower side of a first printed circuit board shown in FIG. 16 and functional circuits inside of the semiconductor chip shown in FIG. 17 are disposed to overlap each other.

Referring to FIG. 18, at least a portion of a plurality of passive components 300a, 300b, 300c, and 300d grouped into groups PG1, PG2, PG3, and PG4 of a plurality of passive components 300 may be disposed to overlap at least one of the plurality of functional circuit units C1, C2, C3, I1, I2, I3, I4, and I5 of the semiconductor chip 400, when viewed from above. For example, the first group PG1 may be disposed directly below the first core functional circuit unit C1 (e.g., such that all first passive components 300a of the first group PG1 are disposed directly below the first core functional circuit C1). The second group PG2 may be disposed directly below the second core functional circuit unit C2 (e.g., such that all second passive components 300b of the second group PG2 are disposed directly below the second core functional circuit C2). The third group PG3 may be disposed directly below the third core functional circuit unit C3 (e.g., such that all third passive components 300c of the third group PG3 are disposed directly below the third core functional circuit C3). As described above, when a plurality of passive components 300a, 300b, and 300c grouped into the groups PG1, PG2, and PG3 are disposed directly below the core functional circuit units C1, C2, and C3, a better power integrity improvement effect may be obtained. Optionally, the fourth group PG4 may be disposed directly below an input/output unit I2 having a relatively larger planar area than each of the other input/output units I1, I3, I4, and I5 (e.g., such that all fourth passive components 300d of the fourth group PG4 are disposed directly below the input/output functional circuit I2). Most of the other contents are substantially the same as described above, and thus, duplicate descriptions are omitted.

Figure 19:
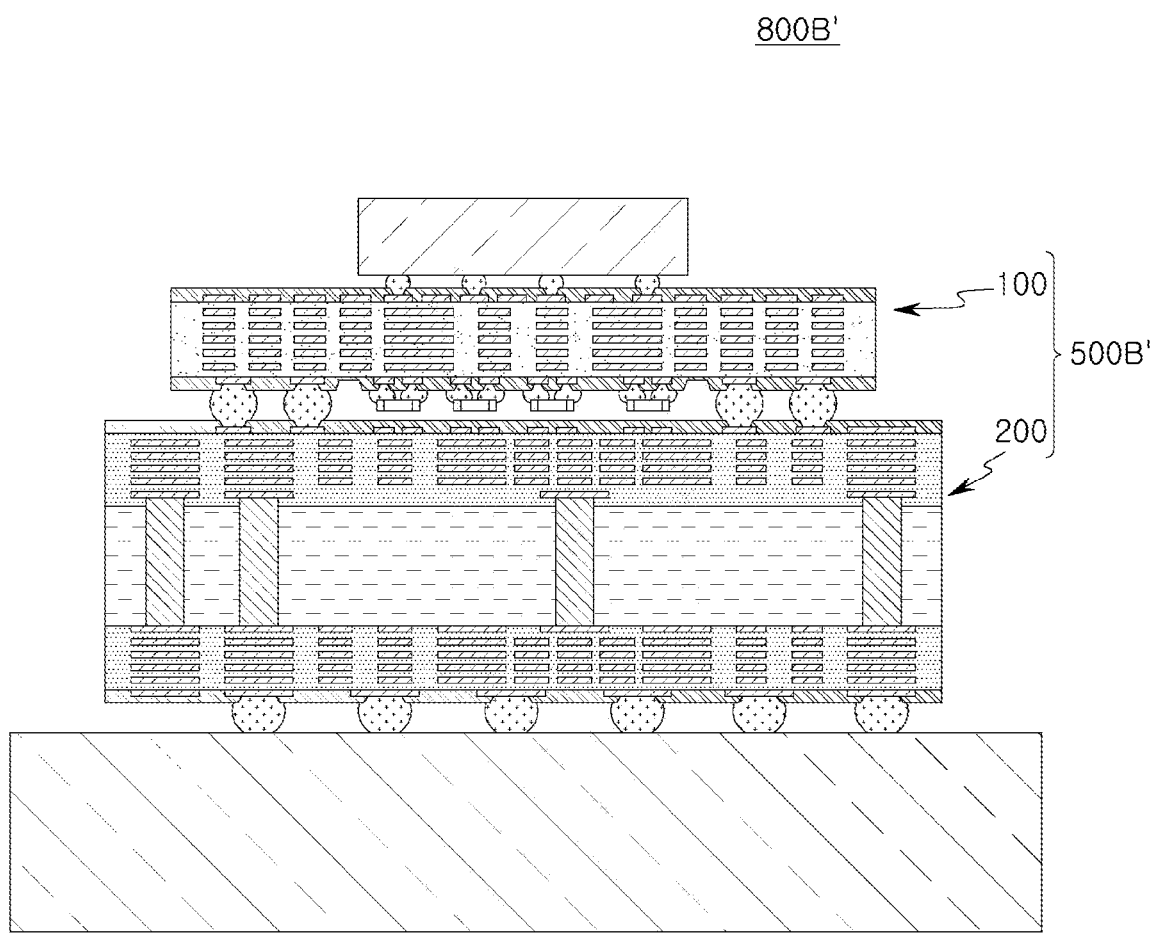
FIG. 19 is a schematic cross-sectional view illustrating a modified example of the electronic device shown in FIG. 15.

FIG. 19 is a schematic cross-sectional view illustrating a modified example of the electronic device in FIG. 15.

Referring to FIG. 19, an electronic device 800B' according to a modified example includes the above-described substrate structure 500B' according to the modified example. For example, a first printed circuit board 100 may be a coreless printed circuit board. Also, a second printed circuit board 200 may be a core-type printed circuit board. Most of the other contents are substantially the same as described above, and thus, duplicate descriptions are omitted.

Figure 20:
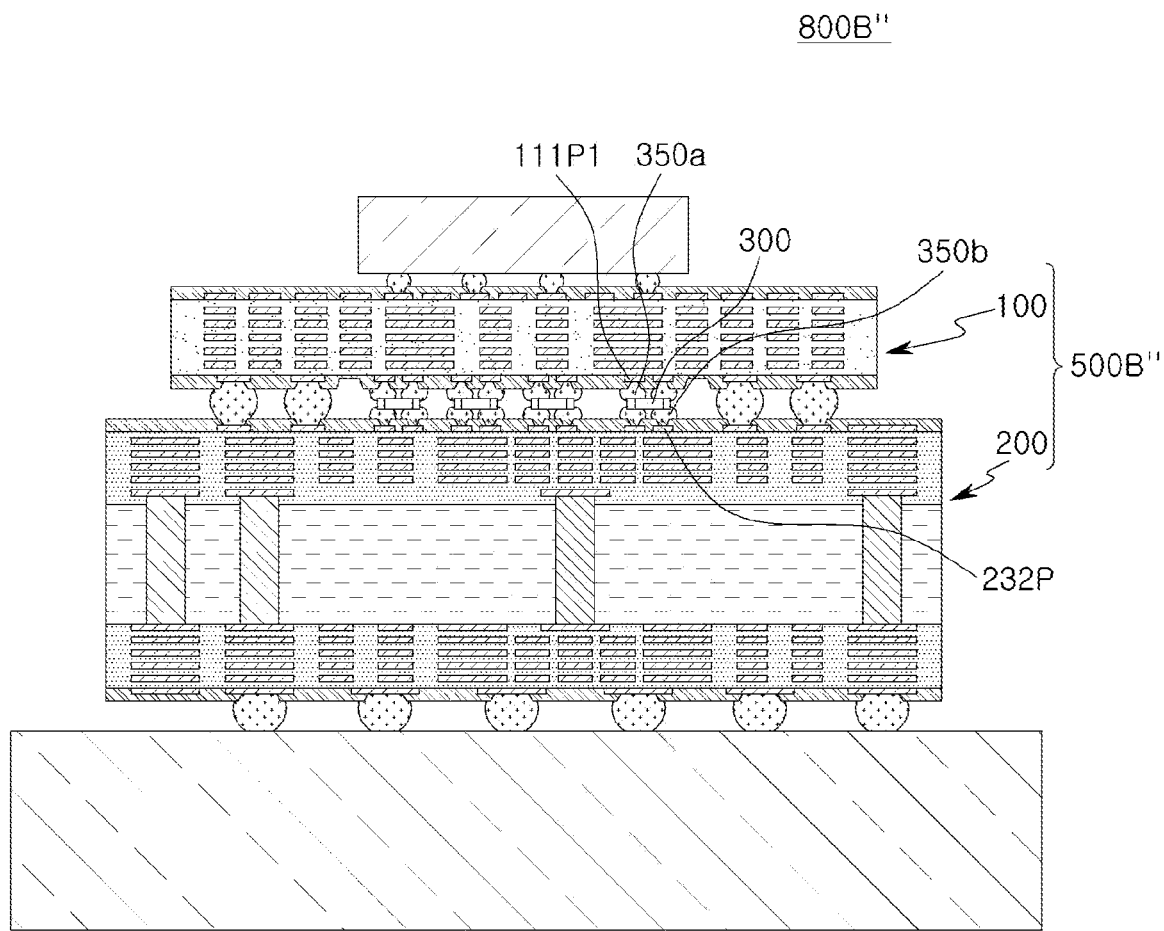
FIG. 20 is a schematic cross-sectional view illustrating a modified example of the electronic device shown in FIG. 15.

FIG. 20 is a schematic cross-sectional view illustrating a modified example of the electronic device in FIG. 15.

Referring to FIG. 20, an electronic device 800B" according to a modified example includes the above-described substrate structure 500B" according to the modified example described above. For example, a passive component 300 may be connected to the first pad 111P1 on a lower side of a first printed circuit board 100 through a first conductive adhesive 350a, and may also be connected to a fourth pad 232P on an upper side of the second printed circuit board 200 through a second conductive adhesive 350b. Most of the other contents are substantially the same as described above, and thus, duplicate descriptions are omitted.

As described above, a substrate structure, capable of keeping up with a high-multilayer and large-scale substrate, and an electronic device including the same may be provided.

In addition, a substrate structure, capable of reducing costs, and an electronic device including the same may be provided.

In addition, a substrate structure, capable of improving power integrity, and an electronic device including the same may be provided.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" includes a physical connection or a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, features of the example embodiments provided herein are generally able to be implemented in combination in whole or in part one with another within a same embodiment. For example, one element described in a particular example embodiment, even if it is not described in another example embodiment, may be understood as a description related to the other example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A substrate structure comprising:
a first printed circuit board having a first side and a second side opposing each other;
a plurality of passive components connected to the first side of the first printed circuit board; and
a semiconductor chip connected to the second side of the printed circuit board,
wherein the plurality of passive components includes a first group, including a plurality of first passive components disposed adjacent to each other, a second group, including a plurality of second passive components disposed adjacent to each other, and a third group including a plurality of third passive components,
the semiconductor chip includes a first functional circuit, a second functional circuit, a third functional circuit, and a fourth functional circuit,
a smallest distance between the first and second groups is greater than at least one of a smallest distance between adjacent first passive components of the plurality of first passive components or a smallest distance between adjacent second passive components of the plurality of second passive components,
at least a portion of the first group overlaps the first functional circuit, when viewed from above, at least a portion of the second group overlaps the second functional circuit, when viewed from above, and at least a portion of the third group overlaps the third functional circuit, when viewed from above,
each of the third and fourth functional circuits includes an input/output unit (IOU), and
the third functional circuit has a larger planar area than the fourth functional circuit.

2. The substrate structure of claim 1, wherein the plurality of first passive components a are disposed at regular intervals from each other, based on a first direction, when viewed from above, and the plurality of second passive components are disposed at regular intervals from each other, based on the first direction, when viewed from above.

3. The substrate structure of claim 1, wherein a count of the first passive components included in the first group is different from a count of the second passive components included in the second group.

4. The substrate structure of claim 1, wherein the plurality of passive components includes a land side capacitor (LSC).

5. The substrate structure of claim 1, further comprising:
a second printed circuit board having a third side and a fourth side opposing each other, wherein the first printed circuit board is disposed on the second printed circuit board such that the first side of the first printed circuit board faces the fourth side of the second printed circuit board, and the plurality of passive components are disposed between the first side of the first printed circuit board and the fourth side of the second printed circuit board.

6. The substrate structure of claim 5, wherein the plurality of passive components are connected to the first side of the first printed circuit board by a first physical connection, and connected to the fourth side of the second printed circuit board by a second physical connection separate from the first physical connection.

7. The substrate structure of claim 6, wherein the plurality of passive components are connected to the first side of the first printed circuit board through a first conductive adhesive, and connected to the fourth side of the second printed circuit board through a second conductive adhesive.

8. The substrate structure of claim 5, further comprising:
a plurality of first connection metals disposed between the first side of the first printed circuit board and the fourth side of the second printed circuit board and connecting the first side of the first printed circuit board and the fourth side of the second printed circuit board.

9. The substrate structure of claim 8, wherein the plurality of first connection metals surrounds the first and second groups, when viewed from above.

10. The substrate structure of claim 5, wherein the first printed circuit board is a coreless printed circuit board, and the second printed circuit board is a core-type printed circuit board.

11. The substrate structure of claim 10, wherein the second printed circuit board has a higher thickness than the first printed circuit board.

12. The substrate structure of claim 10, wherein the second printed circuit board has a larger planar area than the first printed circuit board.

13. An electronic device comprising:
a mainboard;
a first printed circuit board disposed on the mainboard;
a semiconductor chip disposed on one side of the first printed circuit board; and
a plurality of passive components disposed on another side of the first printed circuit board,
wherein the plurality of passive components include a first group, including a plurality of first passive components, and a second group, including a plurality of second passive components,
the semiconductor chip includes a first functional circuit and a second functional circuit disposed adjacent to each other on a plane,
at least a portion of the first group overlaps the first functional circuit, when viewed from above, and at least a portion of the second group overlaps the second functional circuit, when viewed from above,
the plurality of passive components further includes a third group including a plurality of third passive components,
the semiconductor chip further includes a third functional circuit and a fourth functional circuit,
at least a portion of the third group overlaps the third functional circuit, when viewed from above,
each of the third and fourth functional circuits includes an input/output unit (IOU), and
the third functional circuit has a larger planar area than the fourth functional circuit.

14. The electronic device of claim 13, wherein each of the first and second functional circuits includes at least one of a central processing unit (CPU), a graphics processing unit (GPU), a digital signal processor unit (DSPU), an image signal processing unit (ISPU), or a neural processing unit (NPU).

15. The electronic device of claim 13, further comprising:
a second printed circuit board disposed between the mainboard and the first printed circuit board,
wherein the first printed circuit board is disposed on the second printed circuit board, and
the plurality of passive components are disposed between the first and second printed circuit boards.

16. A printed circuit board having first and second surfaces opposing each other in a first direction, and configured for having a semiconductor chip, having first and second functional circuits disposed adjacent to each other on a plane, mounted on the second surface, the printed circuit board comprising:
a planar insulating layer;
first and second passivation layers each disposed between the planar insulating layer and a respective one of the first and second surfaces, and each having openings exposing pads through the respective one of the first or second surface;
a plurality of passive components disposed on the first surface of the printed circuit board and connected to a plurality of pads exposed through the first surface; and
connection metals, each having a lower melting point than copper (Cu), disposed on the pads in the openings of the first and second passivation layers on the first and second surfaces of the printed circuit board,
wherein a first passive component of the plurality of passive components is disposed in an area overlapped in the first direction by the first functional circuit of the semiconductor chip, and a second passive component of the plurality of passive components is spaced apart from the first passive component and is disposed in an area overlapped in the first direction by the second functional circuit of the semiconductor chip, and
the connection metals on the first surface extend to a greater distance from the first surface in the first direction than the passive components of the plurality of passive components.

17. The printed circuit board of claim 16, wherein the plurality of pads exposed through the second surface overlap in the first direction with the plurality of passive components.

18. The printed circuit board of claim 16, further comprising:
a build-up layer disposed between the planar insulating layer and one of the first or second surface of the printed circuit board, and having wiring layers disposed therein and connected to the exposed pads,
wherein at least one passivation layer of the first and second passivation layers is disposed between the build-up layer and the one of the first or second surface.

19. The printed circuit board of claim 16, wherein the plurality of passive components disposed on the first surface of the printed circuit board includes:
a plurality of first passive components disposed adjacent to each other at regular intervals, and disposed in the area overlapped by the first functional circuit of the semiconductor chip, and a plurality of second passive components disposed adjacent to each other at regular intervals, and disposed in the area overlapped by the second functional circuit of the semiconductor chip.

20. The printed circuit board of claim 16, wherein the plurality of passive components disposed on the first surface of the printed circuit board includes:

a plurality of first passive components disposed adjacent to each other, and disposed in the area overlapped by the first functional circuit of the semiconductor chip, and a plurality of second passive components disposed adjacent to each other, and disposed in the area overlapped by the second functional circuit of the semiconductor chip, and wherein the first passive components are closer to each other than to any second passive component, and the second passive components are closer to each other than to any first passive component.

21. An electronic device comprising:

the printed circuit board of claim 16;

the semiconductor chip mounted to the second surface of the printed circuit board; and an interposer substrate mounted to the first surface of the printed circuit board, and including a plurality of wiring layers connected to the pads exposed through the first surface of the printed circuit board.

* * * * *